US010930664B2

(12) United States Patent
Son et al.

(10) Patent No.: US 10,930,664 B2
(45) Date of Patent: Feb. 23, 2021

(54) SEMICONDUCTOR DEVICES INCLUDING CHANNEL STRUCTURES

(71) Applicant: Samsung Electronics Co., Ltd., Suwon-si (KR)

(72) Inventors: Yoon Hwan Son, Hwaseong-si (KR); Seok Cheon Baek, Hwaseong-si (KR); Ji Sung Cheon, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/454,293

(22) Filed: Jun. 27, 2019

(65) Prior Publication Data
US 2020/0185402 A1 Jun. 11, 2020

(30) Foreign Application Priority Data

Dec. 11, 2018 (KR) .................. 10-2018-0158743

(51) Int. Cl.
H01L 27/115 (2017.01)
H01L 27/11578 (2017.01)
H01L 27/11568 (2017.01)
H01L 27/11565 (2017.01)

(52) U.S. Cl.
CPC .. *H01L 27/11578* (2013.01); *H01L 27/11565* (2013.01); *H01L 27/11568* (2013.01)

(58) Field of Classification Search
CPC ......... H01L 27/11578; H01L 27/11565; H01L 27/11568
See application file for complete search history.

(56) References Cited

U.S. PATENT DOCUMENTS

| 9,368,646 | B2 | 6/2016 | Kim et al. |
| 9,508,730 | B2* | 11/2016 | Lee .................... H01L 45/1226 |
| 9,576,969 | B2* | 2/2017 | Manorotkul ...... H01L 21/32055 |
| 9,576,973 | B2 | 2/2017 | Lee et al. |
| 9,653,474 | B2 | 5/2017 | Yune |
| 9,786,673 | B1 | 10/2017 | Cho et al. |
| 9,972,639 | B2* | 5/2018 | Song .................... H01L 23/5329 |
| 10,199,375 | B2* | 2/2019 | Nojima ............. H01L 27/11582 |
| 10,535,599 | B2* | 1/2020 | Kim ........................ H01L 27/115 |
| 10,546,814 | B2* | 1/2020 | Tak ......................... G11C 17/18 |
| 10,756,107 | B2* | 8/2020 | Choi .................. H01L 23/53295 |
| 2016/0093631 | A1* | 3/2016 | Yun .................... H01L 27/11582 257/314 |
| 2017/0330887 | A1* | 11/2017 | Kim .................... H01L 27/1157 |
| 2018/0053775 | A1* | 2/2018 | Nam ................. H01L 27/11582 |
| 2019/0237477 | A1 | 8/2019 | Baek et al. |
| 2020/0144361 | A1* | 5/2020 | Kim ................. H01L 29/66545 |
| 2020/0219898 | A1* | 7/2020 | Kanamori ......... H01L 27/11575 |

FOREIGN PATENT DOCUMENTS

KR    2015-0116995 A    10/2015

* cited by examiner

*Primary Examiner* — Ida M Soward
(74) *Attorney, Agent, or Firm* — Myers Bigel, P.A.

(57) ABSTRACT

A semiconductor device may include a substrate and a stacked structure in which a plurality of insulating layers and a plurality of interconnection layers are alternately stacked on the substrate. An isolation region may cross the stacked structure in a first direction. A plurality of first structures may extend into the stacked structure in a second direction perpendicular to the first direction. A plurality of first patterns may extend into the stacked structure in the second direction in the isolation region. Bottoms of the plurality of first patterns may be farther from an upper surface of the substrate than bottoms of the plurality of channel structures.

16 Claims, 25 Drawing Sheets

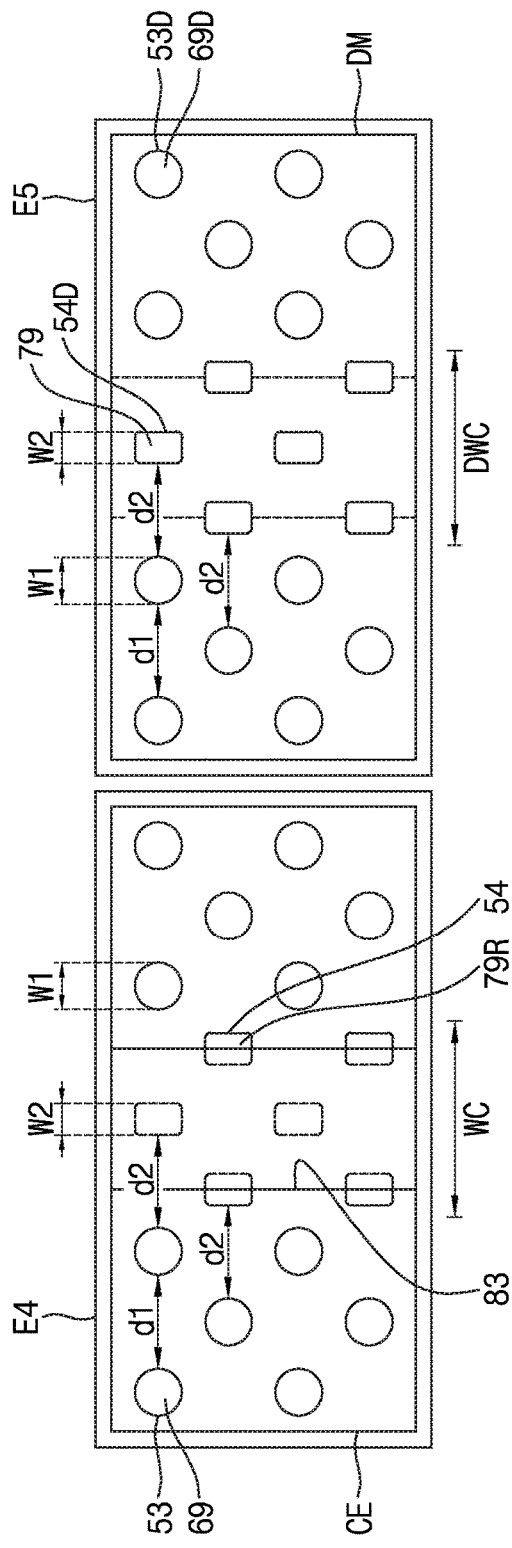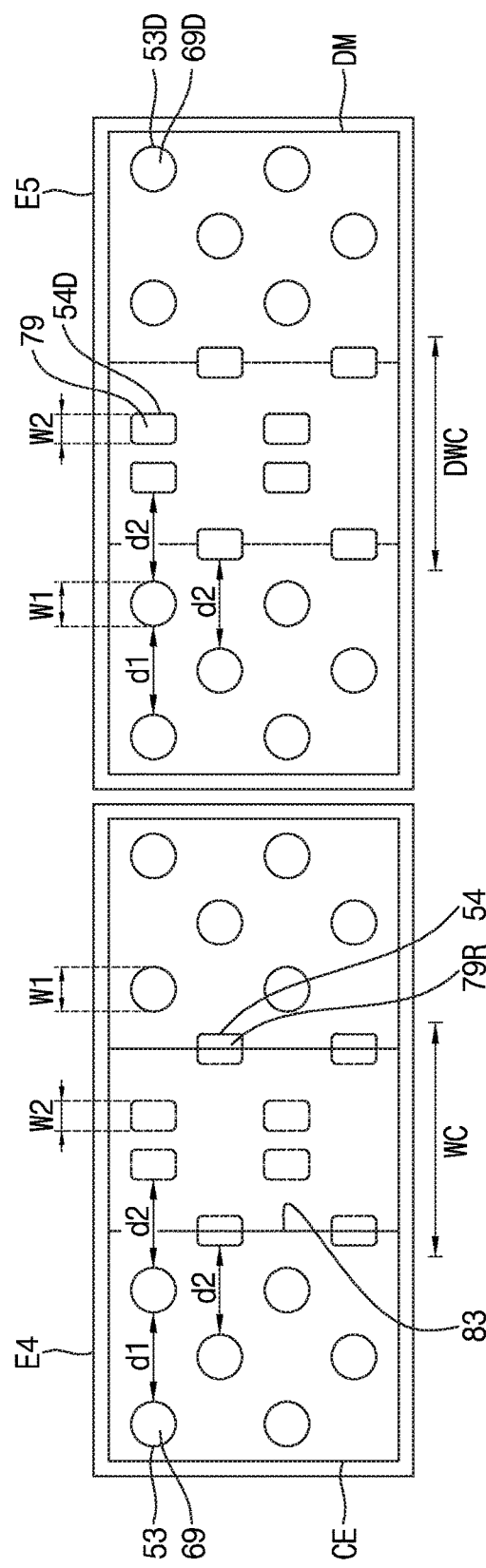

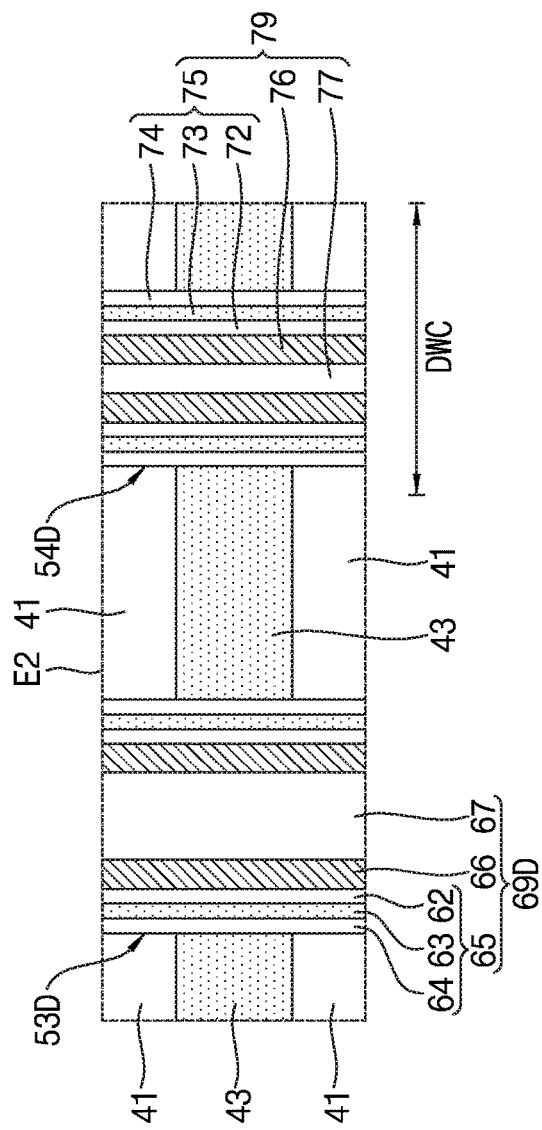
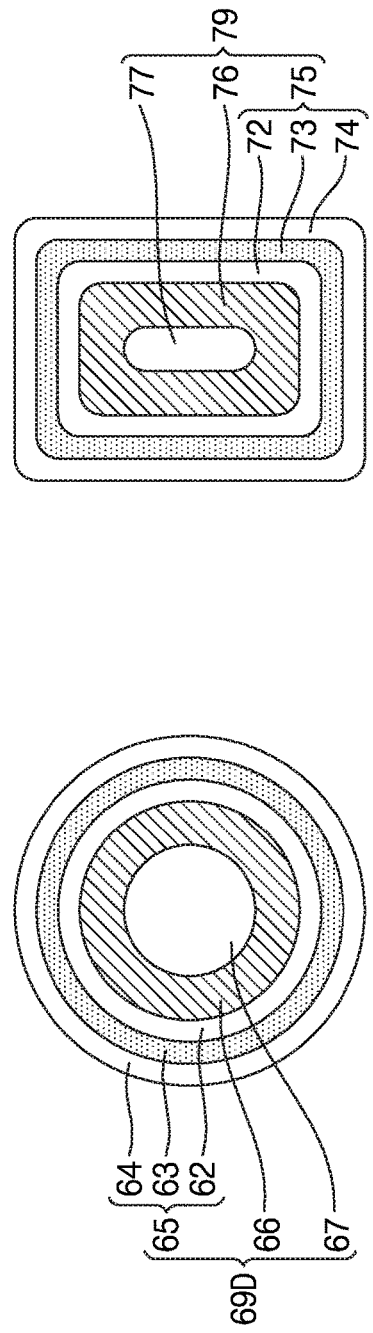

SEMICONDUCTOR DEVICES INCLUDING CHANNEL STRUCTURES

CROSS-REFERENCE TO RELATED APPLICATION

This U.S. non-provisional patent application claims the benefit of priority under 35 U.S.C. § 119 to Korean Patent Application No. 10-2018-0158743, filed on Dec. 11, 2018, in the Korean Intellectual Property Office (KIPO), the disclosure of which is incorporated by reference herein in its entirety.

TECHNICAL FIELD

Aspects of the present disclosure relate to semiconductor devices.

BACKGROUND

As semiconductor devices are becoming increasingly integrated, an aspect ratio of a channel hole in which a channel structure may be formed is gradually increasing. The aspect ratio may be a ratio of a depth of a channel hole relative to a diameter of the channel hole. The increase in aspect ratio may increase the difficulty for the channel hole to be formed vertically. For example, channel holes at edges of a cell block may be vulnerable to process defects such as bending and/or not opening.

SUMMARY

The inventive concepts of the present disclosure are directed to providing semiconductor devices having increased mass production efficiency and increased integration, which may be advantageous. Inventive concepts disclosed herein are directed to methods of forming such semiconductor devices.

According to some example embodiments, there is provided a semiconductor device which includes a substrate and a stacked structure comprising a plurality of insulating layers and a plurality of interconnection layers are alternately stacked on the substrate. An isolation region may cross the stacked structure in a first direction. A plurality of first channel structures may extend into the stacked structure in a second direction that is perpendicular to the first direction. A plurality of first patterns may extend into the stacked structure in the isolation region in the second direction. Bottoms of the plurality of first patterns may be farther from an upper surface of the substrate than bottoms of the plurality of first channel structures.

According to some example embodiments, there is provided a semiconductor device which includes a substrate having a first region and a second region adjacent to the first region. A first stacked structure in which a plurality of insulating layers and a plurality of mold layers are alternately stacked in the second region may be on the substrate. An isolation region may cross the first stacked structure in a first direction. A plurality of dummy channel structures may extend into the first stacked structure in a second direction perpendicular to the first direction. A plurality of dummy patterns may extend into the first stacked structure in the second direction and in the isolation region. Bottoms of the plurality of dummy patterns may be farther from an upper surface of the substrate than bottoms of the plurality of dummy channel structures.

According to some example embodiments, there is provided a semiconductor device which includes a lower stacked structure in which a plurality of lower insulating layers and a plurality of lower interconnection layers are alternately stacked on a substrate. The semiconductor device may include an upper stacked structure, in which a plurality of upper insulating layers and a plurality of upper interconnection layers are alternately stacked, and the upper stacked structure may be on the lower stacked structure. A plurality of channel structures may extend through the upper stacked structure and into the lower stacked structure and may extend in a second direction perpendicular to an upper surface of the substrate. An isolation region may cross the upper stacked structure and the lower stacked structure in a first direction perpendicular to the second direction. A plurality of lower patterns may be in the isolation region and may extend into the lower stacked structure. A plurality of upper patterns may be in the isolation region and may extend into the upper stacked structure. Bottoms of the plurality of lower patterns may be farther from the upper surface of the substrate than bottoms of the plurality of channel structures.

BRIEF DESCRIPTION OF THE FIGURES

FIG. 1 is a cross-sectional view taken along line I-I' of FIG. 3, and FIG. 2 is a cross-sectional view taken along line II-IF of FIG. 3.

FIGS. 4 to 7 are enlarged views showing portions E4 and E5 of FIG. 3 in detail.

FIG. 10 is an enlarged view showing a portion E2 of FIG. 2 in detail, and FIG. 11 is a horizontal sectional view showing a main configuration of FIG. 10.

DETAILED DESCRIPTION

Figure 2:
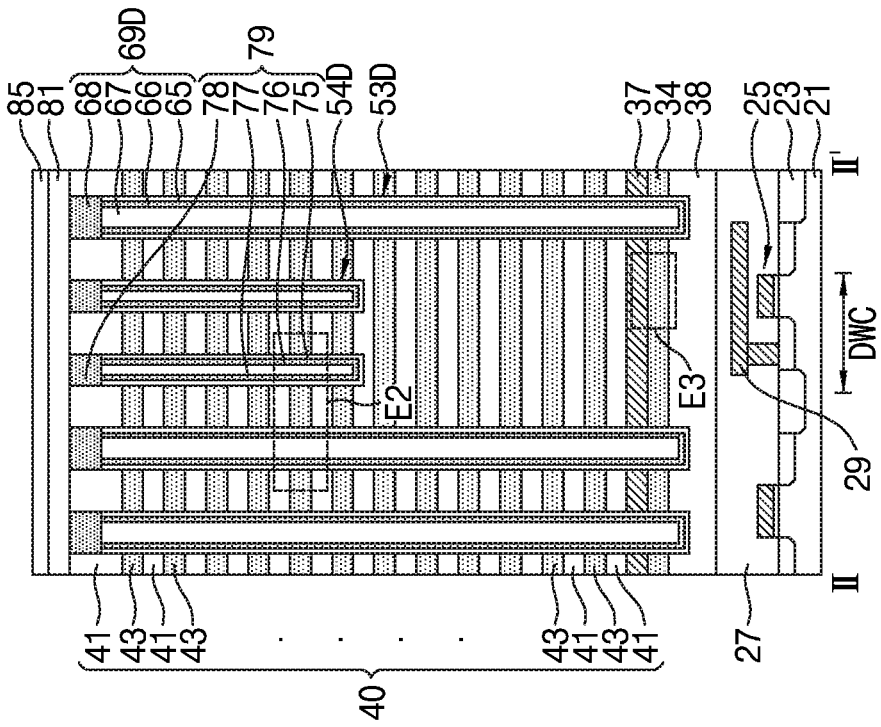
FIGS. 1 and 2 are cross-sectional views.
Figure 1:
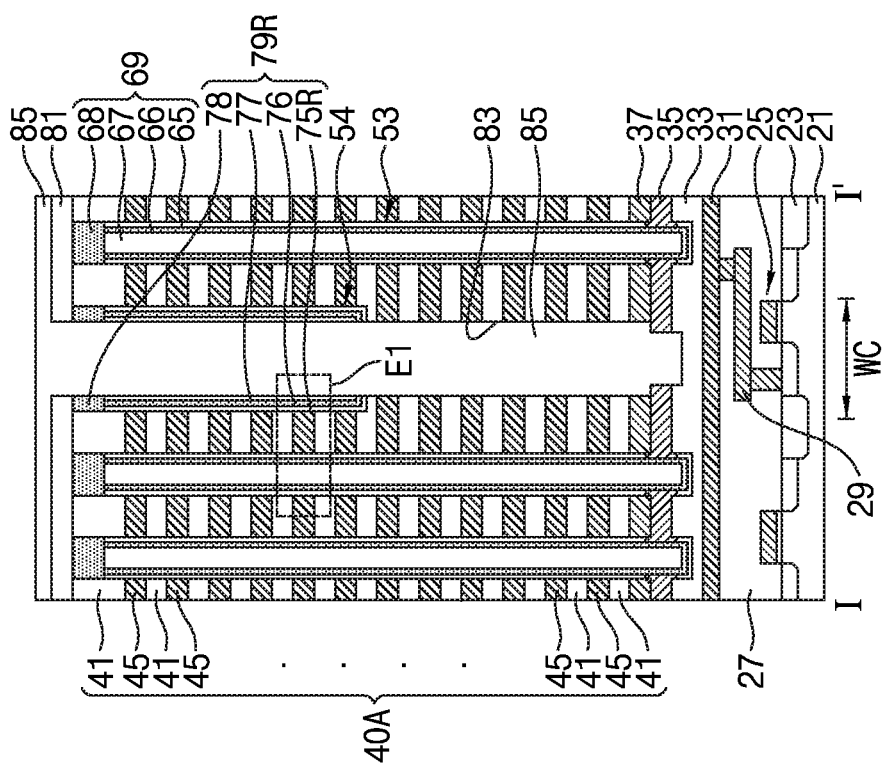
Figure 3:
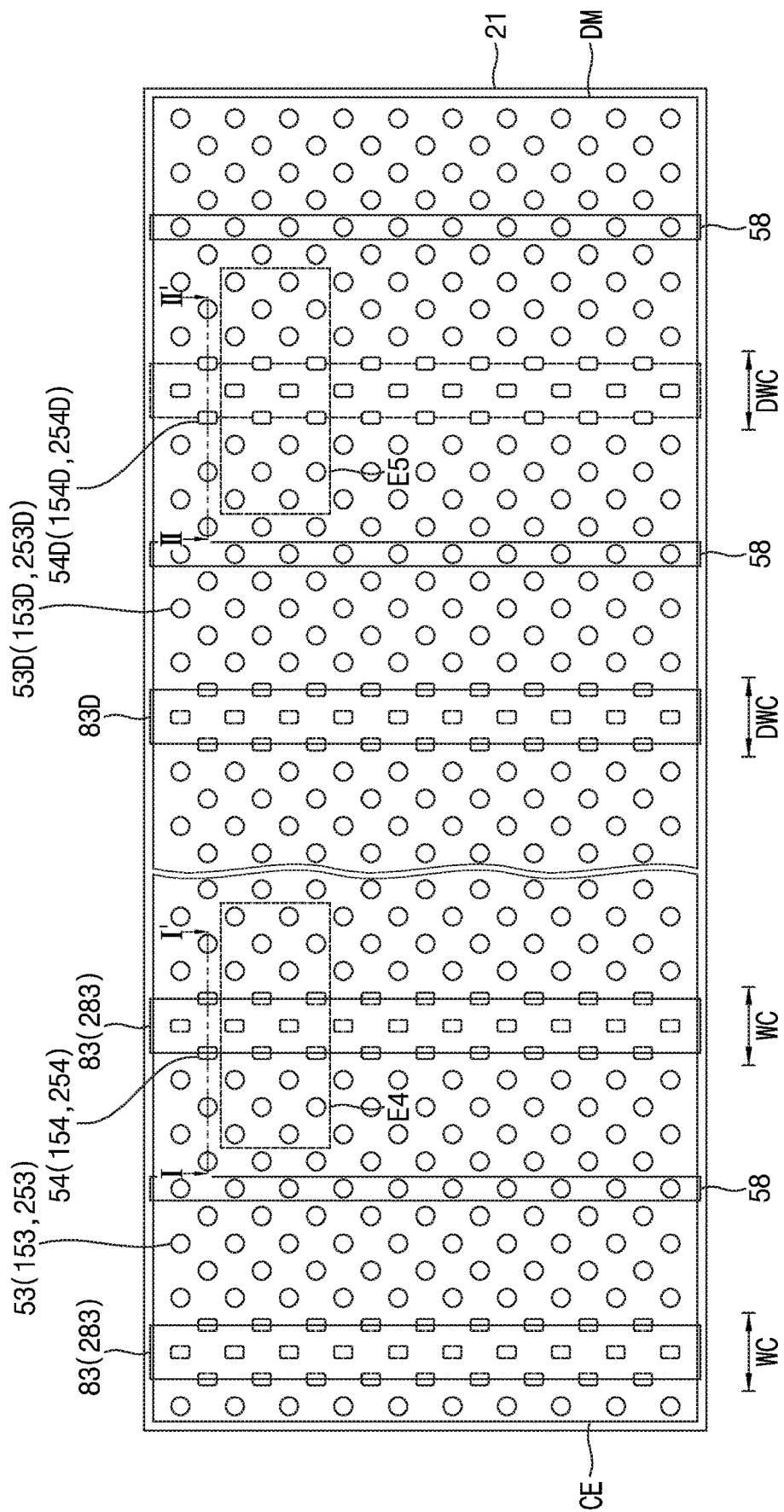
FIG. 3 is a layout or plan view, for describing semiconductor devices according to example embodiments of the inventive concepts.
Figure 8:
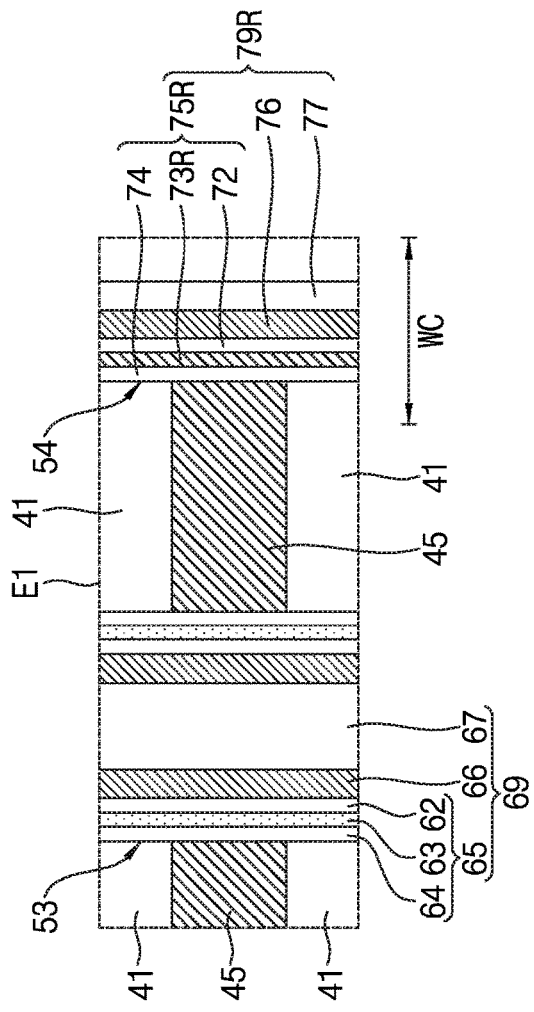
FIG. 8 is an enlarged view showing a portion E1 of FIG. 1 in detail.
Figure 9:
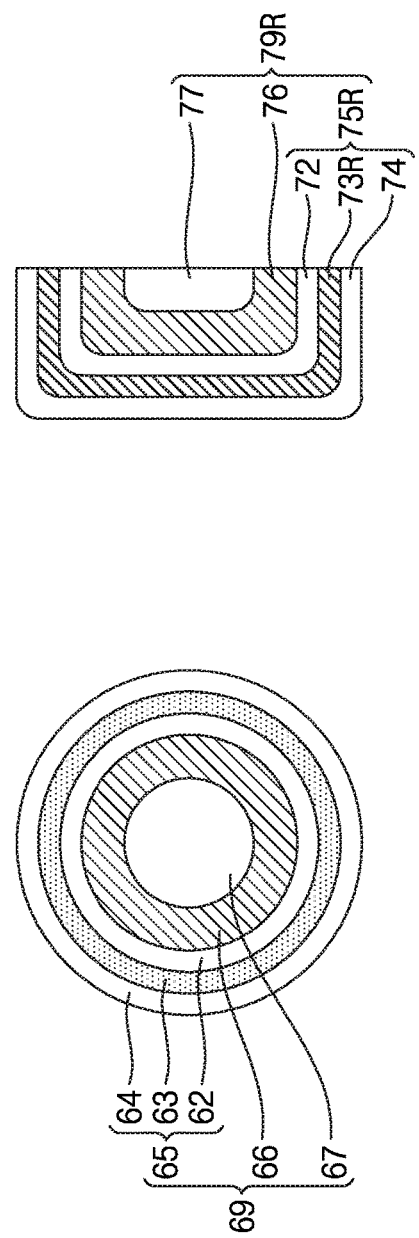
FIG. 9 is a horizontal sectional view showing a main configuration of FIG. 8.
Figure 12:
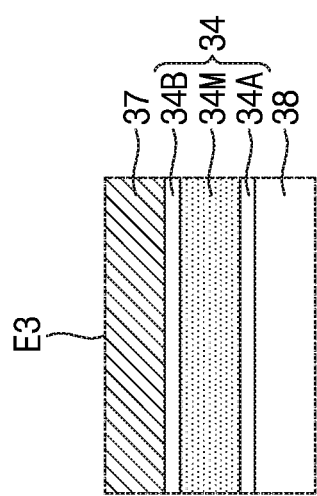
FIG. 12 is an enlarged view showing a portion E3 of FIG. 2 in detail.

FIGS. 1 and 2 are vertical cross-sectional views, and FIG. 3 is a layout or plan view, for describing semiconductor devices according to example embodiments of the inventive concepts. FIG. 1 is a cross-sectional view taken along line I-I' of FIG. 3 in some example embodiments, and FIG. 2 is a cross-sectional view taken along line II-IF of FIG. 3 in some example embodiments. FIGS. 4 to 7 are enlarged views showing portions E4 and E5 of FIG. 3 in detail. FIG. 8 is an enlarged view showing a portion E1 of FIG. 1 in detail, and FIG. 9 is a horizontal sectional view showing a main configuration of FIG. 8. FIG. 10 is an enlarged view showing a portion E2 of FIG. 2 in detail, and FIG. 11 is a horizontal sectional view showing a main configuration of FIG. 10. FIG. 12 is an enlarged view showing a portion E3 of FIG. 2 in detail. The semiconductor devices according to example embodiments of the inventive concepts may include a non-volatile memory device such as a vertical not AND (VNAND) memory or a three-dimensional (3D) flash memory. The semiconductor devices according to example embodiments of the inventive concepts may be interpreted as including a cell on peripheral (COP) structure.

Referring to FIG. 1, a semiconductor device according to some example embodiments of the inventive concepts may include a substrate 21, a device isolation layer 23, a plurality of transistors 25, a first insulating layer 27, a plurality of peripheral circuit interconnections 29, a lower embedded conductive layer 31, an intermediate embedded conductive layer 33, an alternate conductive line 35 (e.g., a source line), a support plate 37, an active stacked (e.g., "stack") structure 40A, a plurality of cell channel holes 53, a plurality of cell ghost holes 54, a plurality of cell channel structures 69, a plurality of cell ghost patterns 79R, a third insulating layer 81, a cell isolation trench 83, and an isolation insulating layer 85.

The active stacked structure 40A may include a plurality of insulating layers 41 and a plurality of electrode layers 45 which are alternately and repeatedly stacked. In other words, a pair of electrode layers 45 that are adjacent to each other may be separated by one of the insulating layers 41.

Each of the plurality of cell channel structures 69 may include an information storage pattern 65, a channel pattern 66, a core pattern 67, and a bit pad 68. Each of the plurality of cell ghost patterns 79R may include a cell ghost information storage pattern 75R, a ghost channel 76, a ghost core 77, and a pad 78. The plurality of cell ghost holes 54, the plurality of cell ghost patterns 79R, the cell isolation trench 83, and the isolation insulating layer 85 may be disposed in a cell isolation region WC. The terms "cell channel structures" and "cell ghost patterns" are non-limiting, and the plurality of cell channel structures 69 may be referred to herein as a plurality of first channel structures, and the plurality of cell ghost patterns 79R may be referred to herein as a plurality of first patterns.

In an example embodiment, the cell isolation trench 83 may be or may correspond to a word line cut. Some of the plurality of electrode layers 45 may be or may correspond to word lines. A lowermost layer of the plurality of electrode layers 45 may be or may correspond to a gate-induced drain leakage (GIDL) control line. A second lower layer of the plurality of electrode layers 45 may be or may correspond to a ground selection line (GSL) or a source selection line (SSL). The alternate conductive line 35 may be or may correspond to a common source line (CSL). An uppermost layer of the plurality of electrode layers 45 may be or may correspond to a GIDL control line. Second and third upper layers of the plurality of electrode layers 45 may be or may correspond to string selection lines (SSLs) or drain selection lines (DSLs).

Referring to FIG. 2, a semiconductor device according to some example embodiments of the inventive concepts may include a substrate 21, a device isolation layer 23, a plurality of transistors 25, a first insulating layer 27, a plurality of peripheral circuit interconnections 29, a source mold layer 34, a support plate 37, a second insulating layer 38, a non-active stacked structure 40, a plurality of dummy channel holes 53D, a plurality of dummy ghost holes 54D, a plurality of dummy channel structures 69D, a plurality of dummy ghost patterns 79, a third insulating layer 81, and an isolation insulating layer 85. As discussed herein, in some example embodiments the structure of FIG. 1 may be located on a first portion of a substrate 21, and the structure of FIG. 2 may be located on a second portion of the same substrate 21.

The non-active stacked structure 40 may include a plurality of insulating layers 41 and a plurality of mold layers 43 which are alternately and repeatedly stacked. In other words, a pair of insulating layers 41 adjacent to each other may be separated by one of the plurality of mold layers 43. Each of the plurality of dummy channel structures 69D may be disposed in a corresponding one of the plurality of dummy channel holes 53D, and each of the dummy channel structures 69D may include an information storage pattern 65, a channel pattern 66, a core pattern 67, and a bit pad 68. Each of the plurality of dummy ghost patterns 79 may be disposed in a corresponding one of the plurality of dummy ghost holes 54D, and each of the plurality of dummy ghost patterns 79 may include a dummy ghost information storage pattern 75, a ghost channel 76, a ghost core 77, and a pad 78. The plurality of dummy ghost holes 54D and the plurality of dummy ghost patterns 79 may be disposed in a dummy isolation region DWC. The terms "dummy channel structures" and "dummy ghost patterns" are non-limiting, and the plurality of dummy channel structures 69D may be referred to herein as a plurality of second channel structures, and the plurality of dummy ghost patterns 79 may be referred to herein as a plurality of second patterns.

Referring to FIG. 3, some semiconductor devices according to some example embodiments of the inventive concepts may include a substrate 21 having a first region CE and a second region DM. As discussed herein, FIG. 1 is a cross-sectional view taken along line I-I' of FIG. 3 in some example embodiments, and FIG. 2 is a cross-sectional view taken along line II-IF of FIG. 3 in some example embodiments. A plurality of cell channel holes 53 may be disposed in the first region CE. A plurality of dummy channel holes 53D may be disposed in the second region DM. A plurality of cell isolation regions WC crossing the first region CE may be disposed. A plurality of dummy isolation regions DWC crossing the second region DM may be disposed. The plurality of cell isolation regions WC may cross the first region CE in a first direction, and the plurality of dummy isolation regions DWC may cross the second region DM in the first direction. A plurality of cell isolation trenches 83 may be disposed in the plurality of cell isolation regions WC. At least one dummy isolation trench 83D may be disposed in the plurality of dummy isolation regions DWC. A plurality of cell ghost holes 54 may be disposed in the plurality of cell isolation regions WC. A plurality of dummy ghost holes 54D may be disposed in the plurality of dummy isolation regions DWC. A plurality of selection line isolation patterns 58 may be disposed in the first region CE and the second region DM.

In some example embodiments, the first region CE may correspond to a cell region. The second region DM may correspond to a dummy region. The second region DM may be disposed adjacent to an outer side or outer portion of the first region CE. The second region DM may be disposed closer to an edge of the substrate 21 than the first region CE.

In some example embodiments, in at least one of the plurality of dummy isolation regions DWC, the dummy isolation trench 83D may be omitted. The at least one of the plurality of dummy isolation regions DWC in which the dummy isolation trench 83D is omitted may be disposed a relatively far distance away from the first region CE. In other words, there may be a first dummy isolation region DWC and a second dummy isolation region DWC located farther from the first region CE, and a dummy isolation trench 83D may be omitted from the second dummy isolation region DWC. The at least one of the plurality of dummy isolation regions DWC in which the dummy isolation trench 83D is omitted may be disposed at an outermost portion of the second region DM, or may be the dummy isolation region or regions DWC farthest from the first region CE.

Referring again to FIGS. 1 to 3, in some example embodiments, a plurality of stacked structures 40 and 40A in which a plurality of insulating layers 41 and a plurality of interconnection layers 43 and 45 are alternately stacked may be disposed on the substrate 21. The plurality of interconnection layers 43 and 45 may include a plurality of mold layers 43 and a plurality of electrode layers 45. The plurality of stacked structures 40 and 40A may include a non-active stacked structure 40 and an active stacked structure 40A. A plurality of isolation regions WC and DWC crossing the plurality of stacked structures 40 and 40A may be provided. The plurality of isolation regions WC and DWC may include a plurality of cell isolation regions WC and a plurality of dummy isolation regions DWC. The plurality of isolation regions WC and DWC may cross the plurality of stacked structures 40 and 40A in a first direction.

A plurality of channel holes 53 and 53D may extend into the plurality of stacked structures 40 and 40A. The plurality of channel holes 53 and 53D may extend into the plurality of stacked structures 40 and 40A in a second direction that is perpendicular to the first direction. The plurality of channel holes 53 and 53D may be perpendicular to, or may be substantially perpendicular to, an upper surface of the substrate 21. The plurality of channel holes 53 and 53D may include a plurality of cell channel holes 53 and a plurality of dummy channel holes 53D. A plurality of channel structures 69 and 69D may be disposed in the plurality of channel holes 53 and 53D. The plurality of channel structures 69 and 69D may be perpendicular to, or may be substantially perpendicular to, the upper surface of the substrate 21. The plurality of channel structures 69 and 69D may include a plurality of cell channel structures 69 and a plurality of dummy channel structures 69D. A plurality of ghost holes 54 and 54D which are disposed in the plurality of isolation regions WC and DWC and pass through the plurality of stacked structures 40 and 40A may be provided. The plurality of ghost holes 54 and 54D may extend into the plurality of stacked structures 40 and 40A in the second direction. The plurality of ghost holes 54 and 54D may be perpendicular to, or may be substantially perpendicular to, the upper surface of the substrate 21. The plurality of ghost holes 54 and 54D may include a plurality of cell ghost holes 54 and a plurality of dummy ghost holes 54D.

A plurality of ghost patterns 79 and 79R may be disposed in the plurality of ghost holes 54 and 54D. The plurality of ghost patterns 79 and 79R may be perpendicular to, or may be substantially perpendicular to, the upper surface of the substrate 21. The plurality of ghost patterns 79 and 79R may include a plurality of dummy ghost patterns 79 and a plurality of cell ghost patterns 79R. Bottoms of the plurality of ghost holes 54 and 54D may be disposed at a higher level than bottoms of the plurality of channel holes 53 and 53D. The bottoms of the plurality of ghost holes 54 and 54D may be disposed at a higher level than a lowermost layer of the plurality of interconnection layers 43 and 45. Bottoms of the plurality of ghost patterns 79 and 79R may be disposed at a higher level than bottoms of the plurality of channel structures 69 and 69D. The bottoms of the plurality of ghost patterns 79 and 79R may be disposed at a higher level than a lowermost layer of the plurality of interconnection layers 43 and 45.

A plurality of isolation trenches 83 and 83D may be disposed in the plurality of isolation regions WC and DWC. The plurality of isolation trenches 83 and 83D may cross the plurality of stacked structures 40 and 40A in a first direction, and may vertically extend into (e.g., pass through at least a portion of) the plurality of stacked structures 40 and 40A in a second direction perpendicular to the first direction. The plurality of isolation trenches 83 and 83D may extend vertically to pass through at least a portion of the plurality of ghost holes 54 and 54D. The plurality of isolation trenches 83 and 83D may include a plurality of cell isolation trenches 83 and at least one dummy isolation trench 83D. An isolation insulating layer 85 may be disposed in the plurality of isolation trenches 83 and 83D.

In some example embodiments, the active stacked structure 40A in which the plurality of insulating layers 41 and the plurality of electrode layers 45 are alternately stacked may be disposed in the first region CE on the substrate 21. The non-active stacked structure 40 in which the plurality of insulating layers 41 and the plurality of mold layers 43 are alternately stacked may be disposed in the second region DM on the substrate 21. Each of the plurality of electrode layers 45 may be disposed at substantially the same level as a corresponding one of the plurality of mold layers 43. The plurality of cell isolation regions WC may cross the active stacked structure 40A. The plurality of dummy isolation regions DWC may cross the non-active stacked structure 40.

The plurality of cell channel holes 53 may extend into the active stacked structure 40A. The plurality of dummy channel holes 53D may extend into the non-active stacked structure 40. The plurality of cell channel structures 69 may be disposed in the plurality of cell channel holes 53. The dummy channel structure 69D may be disposed in the plurality of dummy channel holes 53D. The plurality of cell ghost holes 54 may be in the plurality of cell isolation regions WC and may extend into the active stacked structure 40A. The plurality of dummy ghost holes 54D may be in the plurality of dummy isolation regions DWC and may extend into the non-active stacked structure 40. The plurality of cell ghost patterns 79R may be disposed in the plurality of cell ghost holes 54. The plurality of dummy ghost patterns 79 may be disposed in the plurality of dummy ghost holes 54D.

Each of the plurality of dummy ghost patterns 79 may include the ghost channel 76 and the dummy ghost information storage pattern 75 which surrounds an outer side of the ghost channel 76. Bottoms of the plurality of cell ghost holes 54 may be disposed at a higher level than bottoms of the plurality of cell channel holes 53. Bottoms of the plurality of dummy ghost holes 54D may be disposed at a higher level than bottoms of the plurality of dummy channel holes 53D. Bottoms of the plurality of ghost patterns 79 and 79R may be disposed at a higher level than bottoms of the plurality of channel structures 69 and 69D. The bottoms of the plurality of dummy ghost holes 54D may be disposed at a higher level than a lowermost layer of the plurality of mold layers 43.

The plurality of cell isolation trenches 83 may be disposed in the plurality of cell isolation regions WC and may extend into and/or pass through the active stacked structure 40A. The isolation insulating layer 85 may be disposed in the plurality of cell isolation trenches 83. The plurality of cell isolation trenches 83 may pass through the plurality of cell ghost holes 54. Each of the plurality of cell channel structures 69 and each of the plurality of dummy channel structures 69D may include the channel pattern 66 and the information storage pattern 65 which surrounds an outer side of the channel pattern 66. Each of the plurality of cell ghost patterns 79R may include the ghost channel 76 and the cell ghost information storage pattern 75R. The cell ghost information storage pattern 75R may be disposed between the ghost channel 76 and the active stacked structure 40A.

Referring to FIG. 4, the plurality of ghost holes 54 and 54D may have different shapes and sizes from the plurality of channel holes 53 and 53D. When viewed in a plan view, the plurality of ghost holes 54 and 54D may have a different cross-sectional shape from the plurality of channel holes 53 and 53D. In some example embodiments, each of the plurality of channel holes 53 and 53D may have a circular shape, and each of the plurality of ghost holes 54 and 54D may have a rectangular shape or an elliptical shape. A horizontal width of each of the plurality of ghost holes 54 and 54D may be less than a horizontal width of each of the plurality of channel holes 53 and 53D. A horizontal width of each of the plurality of cell ghost holes 54 may be less than a horizontal width of each of the plurality of cell channel holes 53. A horizontal width of each of the plurality of dummy ghost holes 54D may be less than a horizontal width of each of the plurality of dummy channel holes 53D. In some example embodiments, the plurality of ghost patterns 79R and 79, which are disposed in the plurality of ghost holes 54 and 54D, may have different shapes and sizes from the plurality of channel structures 69 and 69D, which are disposed in the channel holes 53 and 53D. When viewed in a plan view, the plurality of ghost patterns 79R and 79 may have a different cross-sectional shape from the plurality of channel structures 69 and 69D.

In some example embodiments, each of the plurality of ghost holes 54 and 54D may have a width less than or equal to that of each of the plurality of cell channel holes 53 and that of each of the plurality of dummy channel holes 53D. Each of the plurality of dummy channel holes 53D may have substantially the same horizontal width as each of the plurality of cell channel holes 53. Each of the plurality of cell channel holes 53 and each of the plurality of dummy channel holes 53D may have a first width W1. Each of the plurality of cell ghost holes 54 and each of the plurality of dummy ghost holes 54D may have a second width W2. The second width W2 may be less than or equal to the first width W1. The second width W2 may be 0.5 to 1 times the first width W1.

On a straight line passing through at least one selected from among the plurality of ghost holes 54 and at least two selected from among the plurality of channel holes 53, an interval or distance between the at least one selected of the plurality of ghost holes 54 and an adjacent one of the at least two selected of the plurality of channel holes 53 may be substantially the same as an interval between the at least two selected of the plurality of channel holes 53. On a straight line passing through at least one selected from among the plurality of dummy ghost holes 54D and at least two selected from among the plurality of dummy channel holes 53D, an interval or distance between the at least one selected of the plurality of dummy ghost holes 54D and an adjacent one of the at least two selected of the plurality of dummy channel holes 53D may be substantially the same as an interval between the at least two selected of the plurality of dummy channel holes 53D.

In some example embodiments, on a straight line passing through at least one selected from among the plurality of ghost holes 54 and 54D and at least two selected from among the plurality of channel holes 53 and 53D, an interval between the at least two selected of the plurality of channel holes 53 and 53D may be a first distance d1, and an interval between the at least one selected of the plurality of ghost holes 54 and 54D and an adjacent one of the at least two selected of the plurality of channel holes 53 and 53D may be a second distance d2. The second distance d2 may be substantially the same as the first distance d1.

Referring to FIG. 5, each of the plurality of channel holes 53 and 53D may have a circular shape, and each of the plurality of ghost holes 54 and 54D may include various shapes such as a rectangular shape, an elliptical shape, or a combination thereof.

Figure 6:
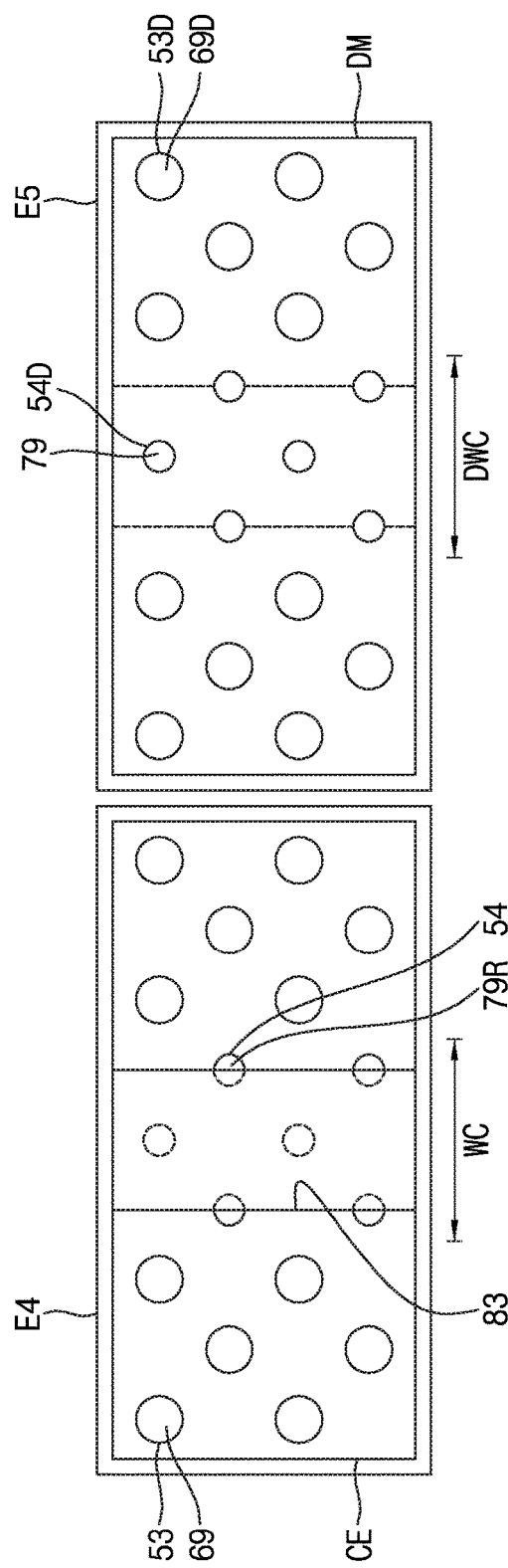

Referring to FIG. 6, each of the plurality of channel holes 53 and 53D may have a circular shape, and each of the plurality of ghost holes 54 and 54D may have a circular shape smaller than that of each of the plurality of channel holes 53 and 53D.

Figure 7:
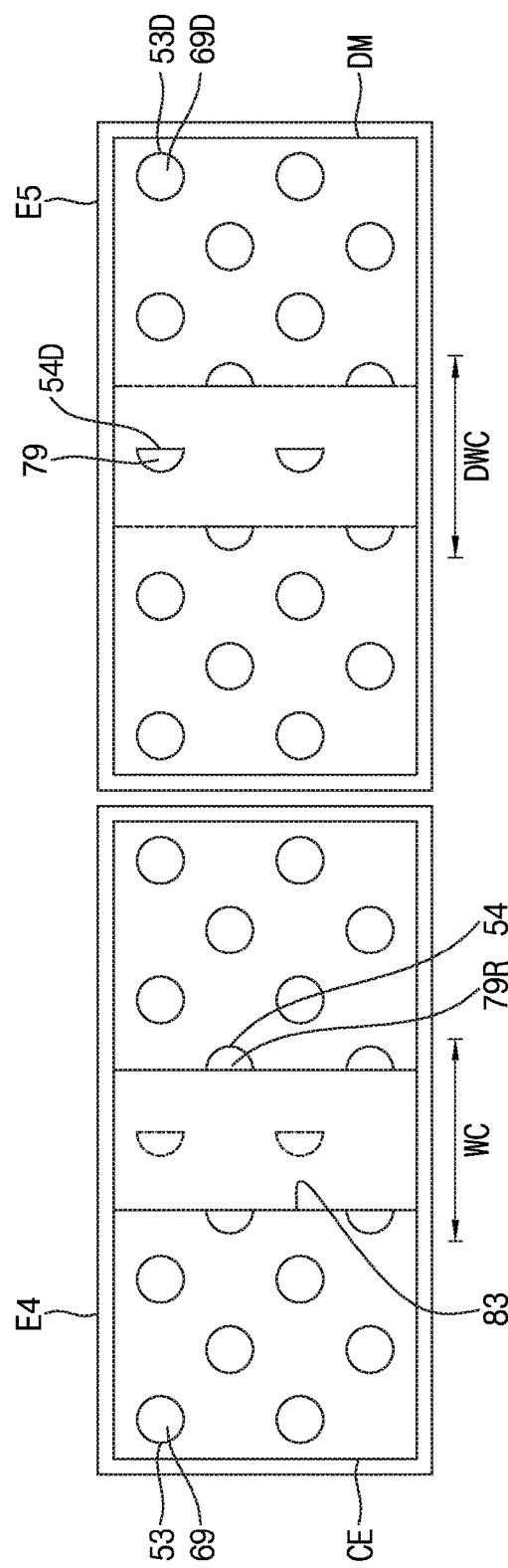

Referring to FIG. 7, each of the plurality of channel holes 53 and 53D may have a circular shape, and each of the plurality of ghost holes 54 and 54D may have a semicircular shape.

Referring to FIGS. 8 and 9, in the cell channel structures 69, the channel pattern 66 may surround an outer side of the core pattern 67. The information storage pattern 65 may include a tunnel insulation layer 62 which surrounds an outer side of the channel pattern 66, a charge storage layer 63 which surrounds an outer side of the tunnel insulation layer 62, and a blocking layer 64 which surrounds an outer side of the charge storage layer 63.

In the ghost pattern 79R, the ghost channel 76 may be disposed between the ghost core 77 and the cell ghost information storage pattern 75R. The cell ghost information storage pattern 75R may be disposed between the ghost channel 76 and the active stacked structure 40A (e.g., insulating layers 41 and/or electrode layers 45). The cell ghost information storage pattern 75R may include a ghost tunnel layer 72 disposed between the ghost channel 76 and the active stacked structure 40A, a ghost exchange layer 73R disposed between the ghost tunnel layer 72 and the active stacked structure 40A, and a ghost blocking layer 74 disposed between the ghost exchange layer 73R and the active stacked structure 40A.

Each of the ghost channel 76, the ghost tunnel layer 72, and the ghost blocking layer 74 may include the same material as a corresponding one of the channel pattern 66, the tunnel insulation layer 62, and the blocking layer 64. The ghost exchange layer 73R may include a material different from that of the charge storage layer 63. The ghost exchange layer 73R may include the same material as the plurality of electrode layers 45. The ghost exchange layer 73R may include W, Ti, TiN, Ta, TaN, AlO, SiN, SiON, or a combination thereof.

Referring to FIGS. 10 and 11, the dummy channel structure 69D may be similar to the cell channel structure 69 described with reference to FIGS. 8 and 9. In the dummy ghost pattern 79, the dummy ghost information storage pattern 75 may include a ghost tunnel layer 72 which surrounds an outer side of the ghost channel 76, a ghost charge storage layer 73 which surrounds an outer side of the ghost tunnel layer 72, and a ghost blocking layer 74 which surrounds an outer side of the ghost charge storage layer 73. Each of the ghost channel 76, the ghost tunnel layer 72, the ghost charge storage layer 73, and the ghost blocking layer 74 may include the same material as a corresponding one of the channel pattern 66, the tunnel insulation layer 62, the charge storage layer 63, and the blocking layer 64.

Referring to FIG. 12, the source mold layer 34 may include a lower source mold layer 34A, an intermediate source mold layer 34M, and an upper source mold layer 34B which are sequentially stacked.

Figure 13:
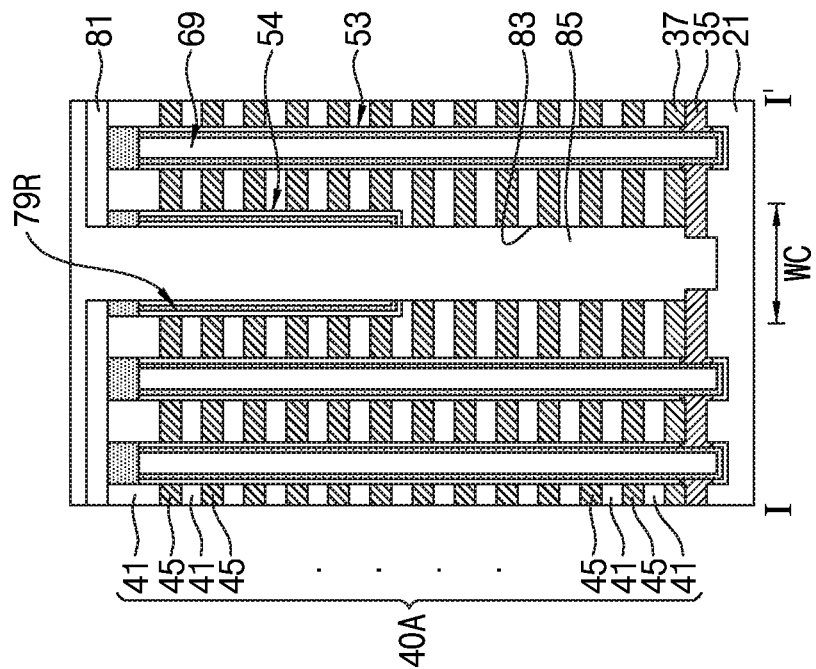
FIG. 13 is a cross-sectional view taken along line I-I' of FIG. 3 for describing semiconductor devices according to example embodiments of the inventive concepts.

FIG. 13 is a cross-sectional view taken along line I-I' of FIG. 3 for describing semiconductor devices according to some example embodiments of the inventive concepts.

Referring to FIG. 13, semiconductor devices according to some example embodiments of the inventive concepts may include a substrate 21, an alternate conductive line 35, a support plate 37, an active stacked structure 40A, a plurality of cell channel holes 53, a plurality of cell ghost holes 54, a plurality of cell channel structures 69, a plurality of cell ghost patterns 79R, a third insulating layer 81, a cell isolation trench 83, and an isolation insulating layer 85. FIG. 13 differs from, e.g., FIG. 1, in that in some example embodiments of the inventive concepts, the alternate conductive line 35 may be in direct contact with the substrate 21.

Figure 14:
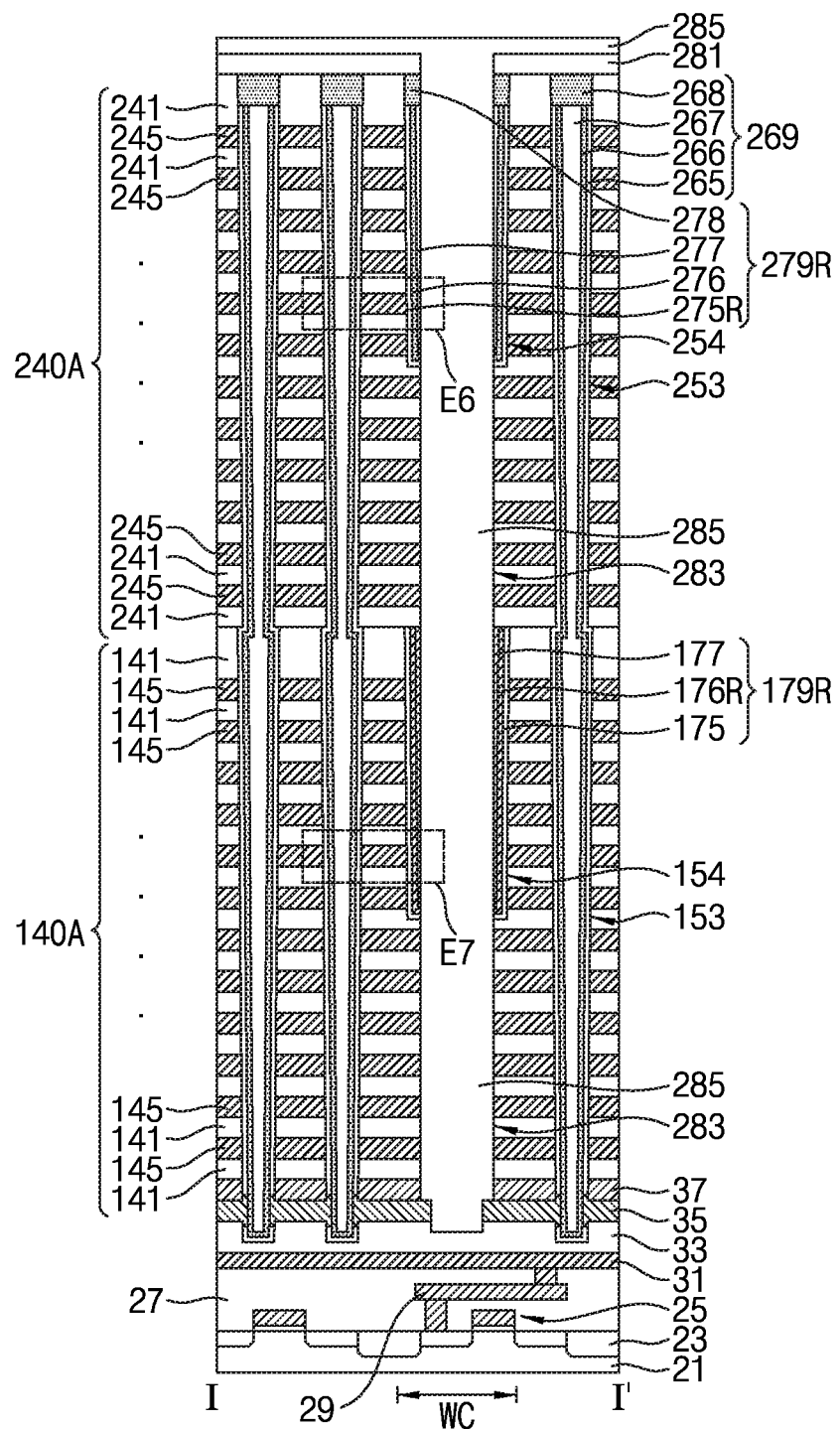
FIG. 14 is a cross-sectional view taken along line I-I' of FIG. 3 for describing semiconductor devices according to an example embodiments of the inventive concepts.
Figure 15:
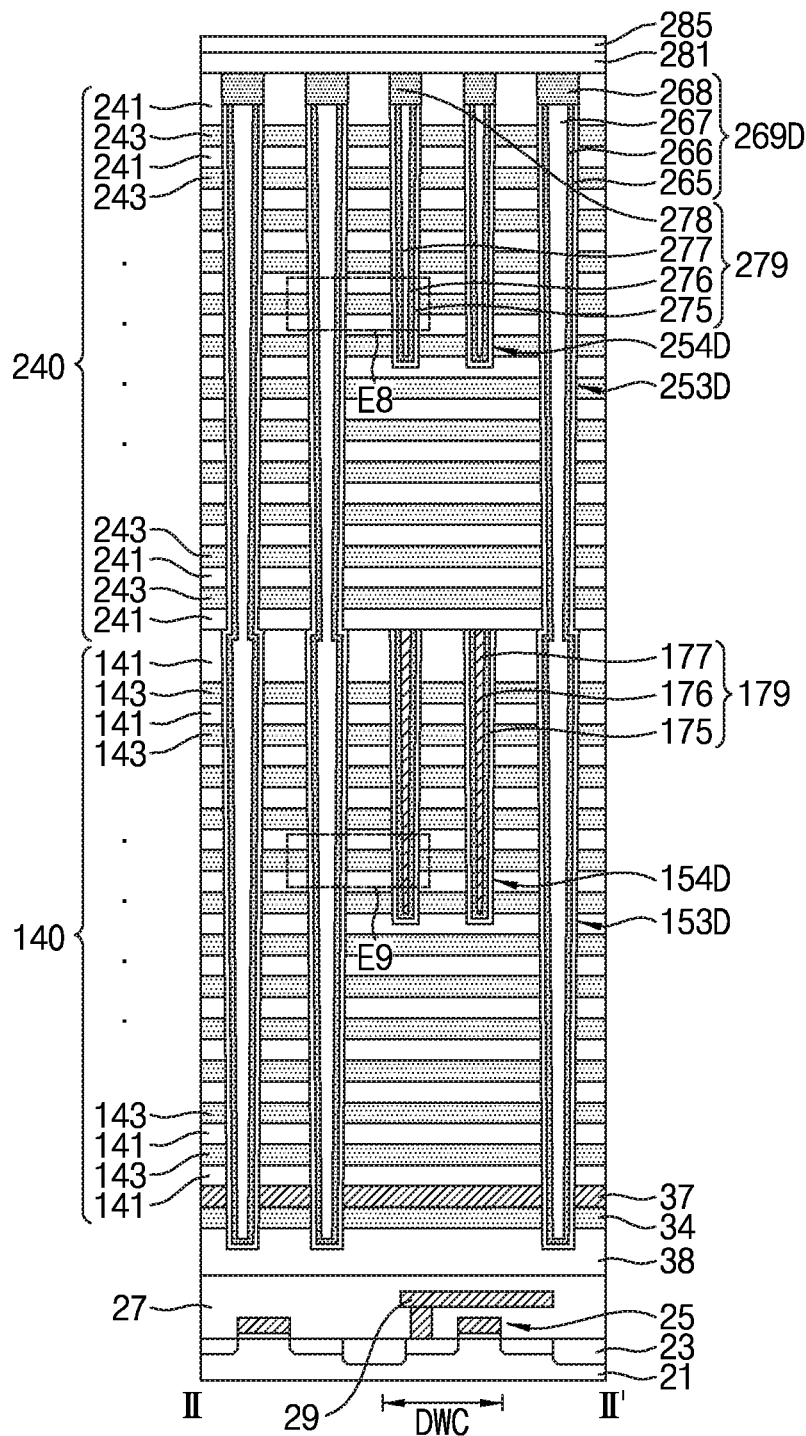
FIG. 15 is a cross-sectional view taken along line II-IF of FIG. 3.
Figure 16:
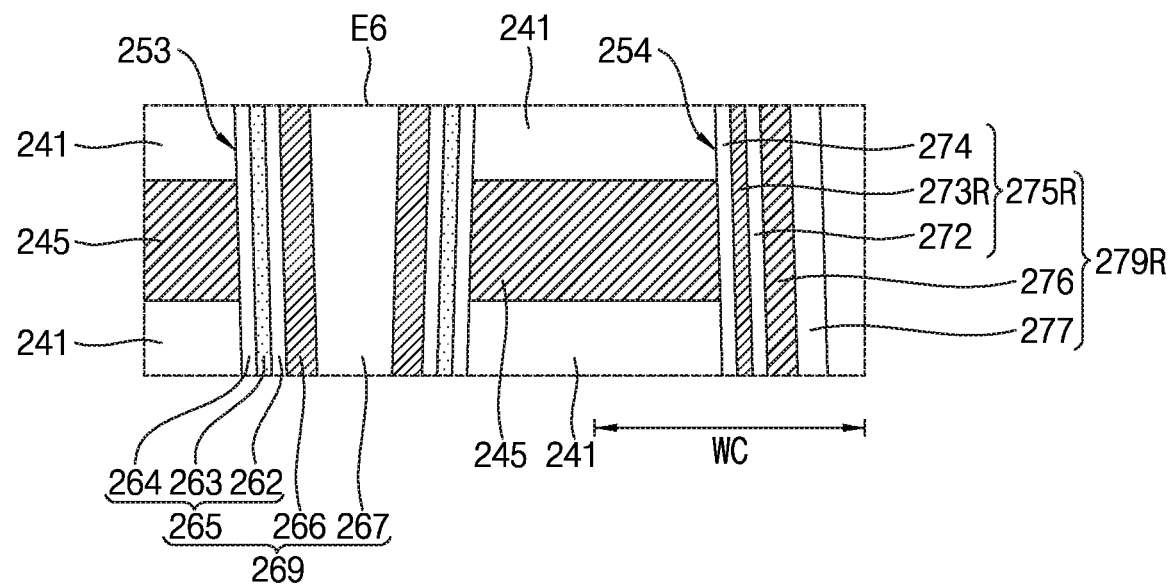
FIGS. 16 and 17 are enlarged views showing portions E6 and E7 of FIG. 14 in detail.
Figure 17:
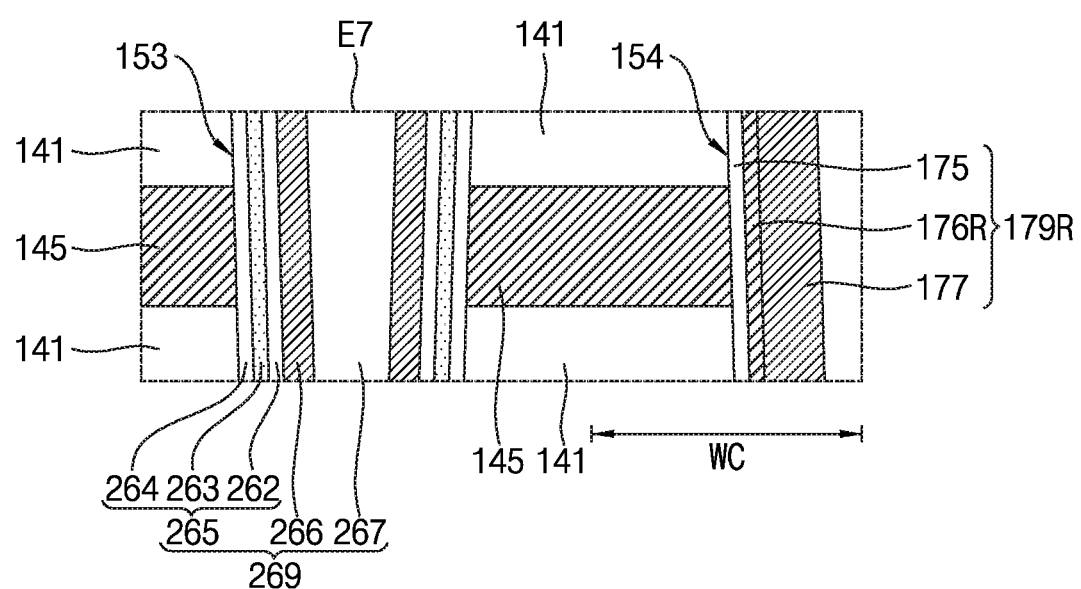
Figure 18:
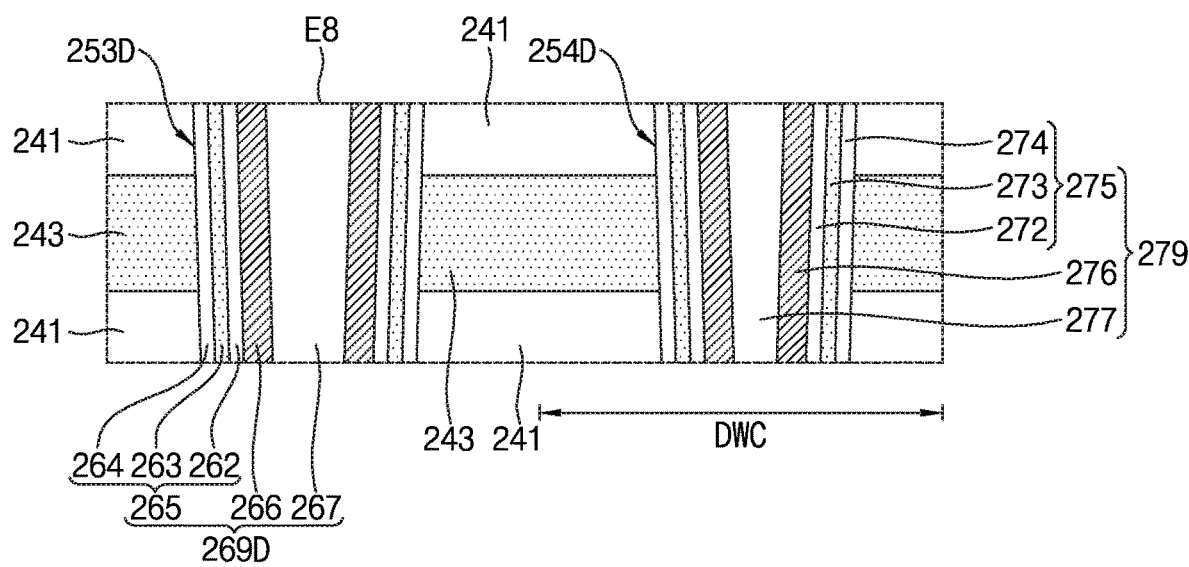
FIGS. 18 and 19 are enlarged views showing portions E8 and E9 of FIG. 15 in detail.
Figure 19:
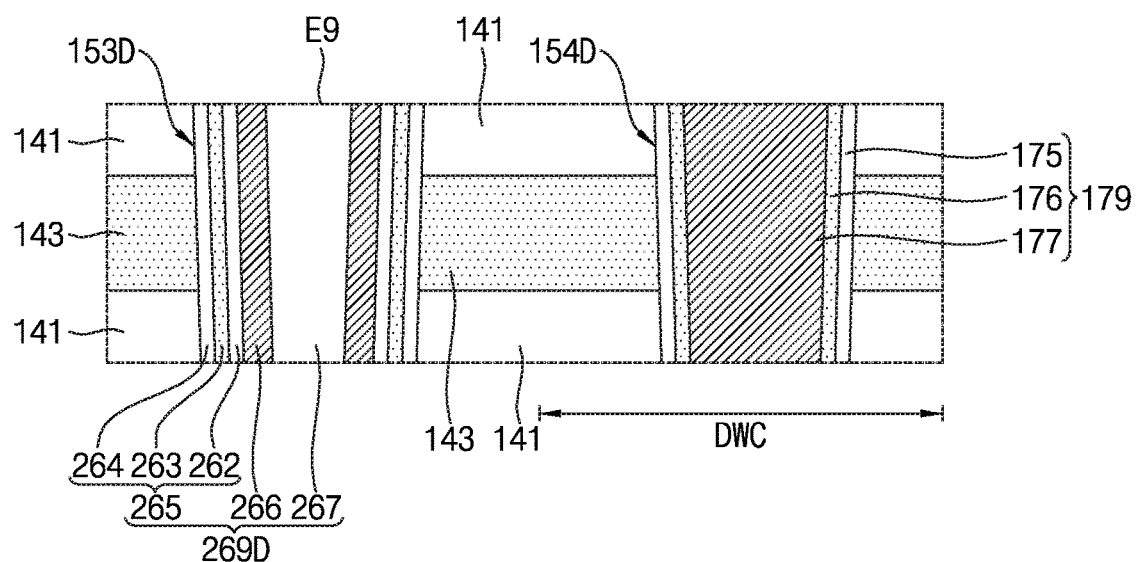

FIG. 14 is a cross-sectional view taken along line I-I' of FIG. 3 for describing semiconductor devices according to some example embodiments of the inventive concepts. FIG. 15 is a cross-sectional view taken along line II-IF of FIG. 3. FIGS. 16 and 17 are enlarged views showing portions E6 and E7 of FIG. 14 in detail. FIGS. 18 and 19 are enlarged views showing portions E8 and E9 of FIG. 15 in detail.

Referring to FIG. 14, some semiconductor devices according to example embodiments of the inventive concepts may include a substrate 21, a device isolation layer 23, a plurality of transistors 25, a first insulating layer 27, a plurality of peripheral circuit interconnections 29, a lower embedded conductive layer 31, an intermediate embedded conductive layer 33, an alternate conductive line 35, a support plate 37, a lower active stacked structure 140A, a plurality of lower cell channel holes 153, a plurality of lower cell ghost holes 154, a plurality of lower cell ghost patterns 179R, an upper active stacked structure 240A, a plurality of upper cell channel holes 253, a plurality of upper cell ghost holes 254, a plurality of cell channel structures 269, a plurality of upper cell ghost patterns 279R, a third insulating layer 281, a cell isolation trench 283, and an isolation insulating layer 285.

The lower active stacked structure 140A may include a plurality of lower insulating layers 141 and a plurality of lower electrode layers 145 which are alternately and repeatedly stacked. Each of the plurality of lower cell ghost patterns 179R may include a first dummy pattern 175, a second dummy exchange pattern 176R, and a third dummy pattern 177. The upper active stacked structure 240A may include a plurality of upper insulating layers 241 and a plurality of upper electrode layers 245 which are alternately and repeatedly stacked. Each of the plurality of cell channel structures 269 may include an information storage pattern 265, a channel pattern 266, a core pattern 267, and a bit pad 268.

Each of the plurality of upper cell ghost patterns 279R may include an upper cell ghost information storage pattern 275R, an upper ghost channel 276, an upper ghost core 277, and an upper pad 278. The plurality of lower cell ghost holes 154, the plurality of lower cell ghost patterns 179R, the plurality of upper cell ghost holes 254, the plurality of upper cell ghost patterns 279R, the cell isolation trench 283, and the isolation insulating layer 285 may be disposed in a cell isolation region WC.

Referring to FIG. 15, some semiconductor devices according to some example embodiments of the inventive concepts may include a substrate 21, a device isolation layer 23, a plurality of transistors 25, a first insulating layer 27, a plurality of peripheral circuit interconnections 29, a source mold layer 34, a support plate 37, a second insulating layer 38, a lower non-active stacked structure 140, a plurality of lower dummy channel holes 153D, a plurality of lower dummy ghost holes 154D, a plurality of lower dummy ghost patterns 179, an upper non-active stacked structure 240, a plurality of upper dummy channel holes 253D, a plurality of upper dummy ghost holes 254D, a plurality of dummy channel structures 269D, a plurality of upper dummy ghost patterns 279, a third insulating layer 281, and an isolation insulating layer 285.

The lower non-active stacked structure 140 may include a plurality of lower insulating layers 141 and a plurality of lower mold layers 143 which are alternately and repeatedly stacked. Each of the plurality of lower dummy ghost patterns 179 may include a first dummy pattern 175, a second dummy pattern 176, and a third dummy pattern 177. The upper non-active stacked structure 240 may include a plurality of upper insulating layers 241 and a plurality of upper mold layers 243 which are alternately and repeatedly stacked. Each of the plurality of dummy channel structures 269D may include an information storage pattern 265, a channel pattern 266, a core pattern 267, and a bit pad 268.

Each of the plurality of upper dummy ghost patterns 279 may include an upper dummy ghost information storage pattern 275, an upper ghost channel 276, an upper ghost core 277, and an upper pad 278. The plurality of lower dummy ghost holes 154D, the plurality of lower dummy ghost patterns 179, the plurality of upper dummy ghost holes 254D, and the plurality of upper dummy ghost patterns 279 may be disposed in a dummy isolation region DWC.

Referring again to FIGS. 3, 14, and 15, in some example embodiments, lower stacked structures 140 and 140A in which the plurality of lower insulating layers 141 and the plurality of lower interconnection layers 143 and 145 are alternately stacked may be disposed on the substrate 21. The plurality of lower interconnection layers 143 and 145 may include the plurality of lower mold layers 143 and the plurality of lower electrode layers 145. The plurality of lower stacked structures 140 and 140A may include the lower non-active stacked structure 140 and the lower active stacked structure 140A. The lower non-active stacked structure 140 may include the plurality of lower mold layers 143, and the lower active stacked structure 140A may include the plurality of lower electrode layers 145.

The plurality of lower channel holes 153 and 153D may extend into the lower stacked structures 140 and 140A. The plurality of lower channel holes 153 and 153D may include the plurality of lower cell channel holes 153 and the plurality of lower dummy channel holes 153D. The upper stacked structures 240 and 240A in which the plurality of upper insulating layers 241 and the plurality of upper interconnection layers 243 and 245 are alternately stacked may be disposed on the lower stacked structures 140 and 140A. The plurality of upper interconnection layers 243 and 245 may include the plurality of upper mold layers 243 and the plurality of upper electrode layers 245. The plurality of upper stacked structures 240 and 240A may include the upper non-active stacked structure 240 and the upper active stacked structure 240A. The upper non-active stacked structure 240 may vertically overlap the lower non-active stacked structure 140, and the upper active stacked structure 240A may vertically overlap the lower active stacked structure 140A.

The plurality of upper channel holes 253 and 253D may extend into the upper stacked structures 240 and 240A and may vertically overlap with or communicate with the plurality of lower channel holes 153 and 153D. The plurality of upper channel holes 253 and 253D may include the plurality of upper cell channel holes 253 and the plurality of upper dummy channel holes 253D. The plurality of channel structures 269 and 269D may be disposed in the plurality of upper channel holes 253 and 253D and the plurality of lower channel holes 153 and 153D. The plurality of channel structures 269 and 269D may include the plurality of cell channel structures 269 and the plurality of dummy channel structures 269D.

The plurality of isolation regions WC and DWC may cross the upper stacked structures 240 and 240A and the lower stacked structures 140 and 140A in a first direction. The plurality of isolation regions WC and DWC may include the plurality of cell isolation regions WC and the plurality of dummy isolation regions DWC. The plurality of lower ghost holes 154 and 154D may be in the isolation regions WC and DWC and may extend into the lower stacked structures 140 and 140A in a second direction that is perpendicular to the first direction. The second direction may be perpendicular to an upper surface of the substrate 21. The plurality of lower ghost holes 154 and 154D may include the plurality of lower cell ghost holes 154 and the plurality of lower dummy ghost holes 154D. The plurality of lower ghost patterns 179 and 179R may be disposed in the plurality of lower ghost holes 154 and 154D. The plurality of lower ghost patterns 179 and 179R may include the plurality of lower dummy ghost patterns 179 and the plurality of lower cell ghost patterns 179R. The plurality of lower ghost patterns 179 and 179R may extend into the lower stacked structures 140 and 140A in the second direction.

The plurality of upper ghost holes 254 and 254D, which may be in the isolation regions WC and DWC, may extend into the upper stacked structures 240 and 240A. The plurality of upper ghost holes 254 and 254D may extend in the second direction and may be perpendicular to the upper surface of the substrate 21. The plurality of upper ghost holes 254 and 254D may include the plurality of upper cell ghost holes 254 and the plurality of upper dummy ghost holes 254D. The plurality of upper ghost patterns 279 and 279R may be disposed in the plurality of upper ghost holes 254 and 254D. The plurality of upper ghost patterns 279 and 279R may extend in the second direction and may be perpendicular to the upper surface of the substrate 21. The plurality of upper ghost patterns 279 and 279R may include the plurality of upper dummy ghost patterns 279 and the plurality of upper cell ghost patterns 279R.

Bottoms of the plurality of lower ghost holes 154 and 154D may be disposed at a higher level than bottoms of the plurality of lower channel holes 153 and 153D. Bottoms of the plurality of lower ghost patterns 179 and 179R may be at a higher level than bottoms of the plurality of lower channel patterns 169 and 169D. Upper surfaces of the plurality of lower ghost patterns 179 and 179R and upper surfaces of the lower stacked structures 140 and 140A may be substantially coplanar. Bottoms of the plurality of upper ghost holes 254 and 254D may be disposed at a higher level than bottoms of the plurality of upper channel holes 253 and 253D. Bottoms of the plurality of upper ghost patterns 279 and 279R may be at a higher level than bottoms of the plurality of upper channel patterns 269 and 269D. The bottoms of the plurality of lower ghost holes 154 and 154D may be disposed at a higher level than a lowermost layer of the plurality of lower interconnection layers 143 and 145. The bottoms of the plurality of upper ghost holes 254 and 254D may be disposed at a higher level than a lowermost layer of the plurality of upper interconnection layers 243 and 245.

Similar to that described with reference to FIGS. 4 to 7, a horizontal width of each of the plurality of lower ghost holes 154 and 154D may be less than a horizontal width of each of the plurality of lower channel holes 153 and 153D. A horizontal width of each of the plurality of upper ghost holes 254 and 254D may be less than a horizontal width of each of the plurality of upper channel holes 253 and 253D. On a straight line passing through at least one selected from among the plurality of lower ghost holes 154 and 154D and at least two selected from among the plurality of lower channel holes 153 and 153D, an interval or distance between the at least one selected of the plurality of lower ghost holes 154 and 154D and an adjacent one of the at least two selected of the plurality of lower channel holes 153 and 153D may be substantially the same as an interval or distance between the at least two selected of the plurality of lower channel holes 153 and 153D. On a straight line passing through at least one selected from among the plurality of upper ghost holes 254 and 254D and at least two selected from among the plurality of upper channel holes 253 and 253D, an interval or distance between the at least one selected of the plurality of upper ghost holes 254 and 254D and an adjacent one of the at least two selected of the plurality of upper channel holes 253 and 253D may be substantially the same as an interval or distance between the at least two selected of the plurality of upper channel holes 253 and 253D.

Referring to FIG. 16, the upper cell ghost pattern 279R may include the upper cell ghost information storage pattern 275R, the upper ghost channel 276, and the upper ghost core 277. The upper cell ghost information storage pattern 275R may include an upper ghost tunnel layer 272, an upper ghost exchange layer 273R, and an upper ghost blocking layer 274. The cell channel structure 269 may include the information storage pattern 265, the channel pattern 266, and the core pattern 267. The information storage pattern 265 may include a tunnel insulation layer 262 which surrounds an outer side of the channel pattern 266, a charge storage layer 263 which surrounds an outer side of the tunnel insulation layer 262, and a blocking layer 264 which surrounds an outer side of the charge storage layer 263.

Referring to FIG. 17, the lower cell ghost pattern 179R may include the first dummy pattern 175, the second dummy exchange pattern 176R, and the third dummy pattern 177.

Referring to FIG. 18, the upper dummy ghost pattern 279 may include the upper dummy ghost information storage pattern 275, the upper ghost channel 276, and the upper ghost core 277. The upper dummy ghost information storage pattern 275 may include an upper ghost tunnel layer 272, an upper ghost charge storage layer 273, and an upper ghost blocking layer 274. The dummy channel structure 269D may include the information storage pattern 265, the channel pattern 266, and the core pattern 267. The information storage pattern 265 may include the tunnel insulation layer 262, the charge storage layer 263, and the blocking layer 264.

Referring to FIG. 19, the lower dummy ghost pattern 179 may include the first dummy pattern 175, the second dummy pattern 176, and the third dummy pattern 177.

Figure 20:
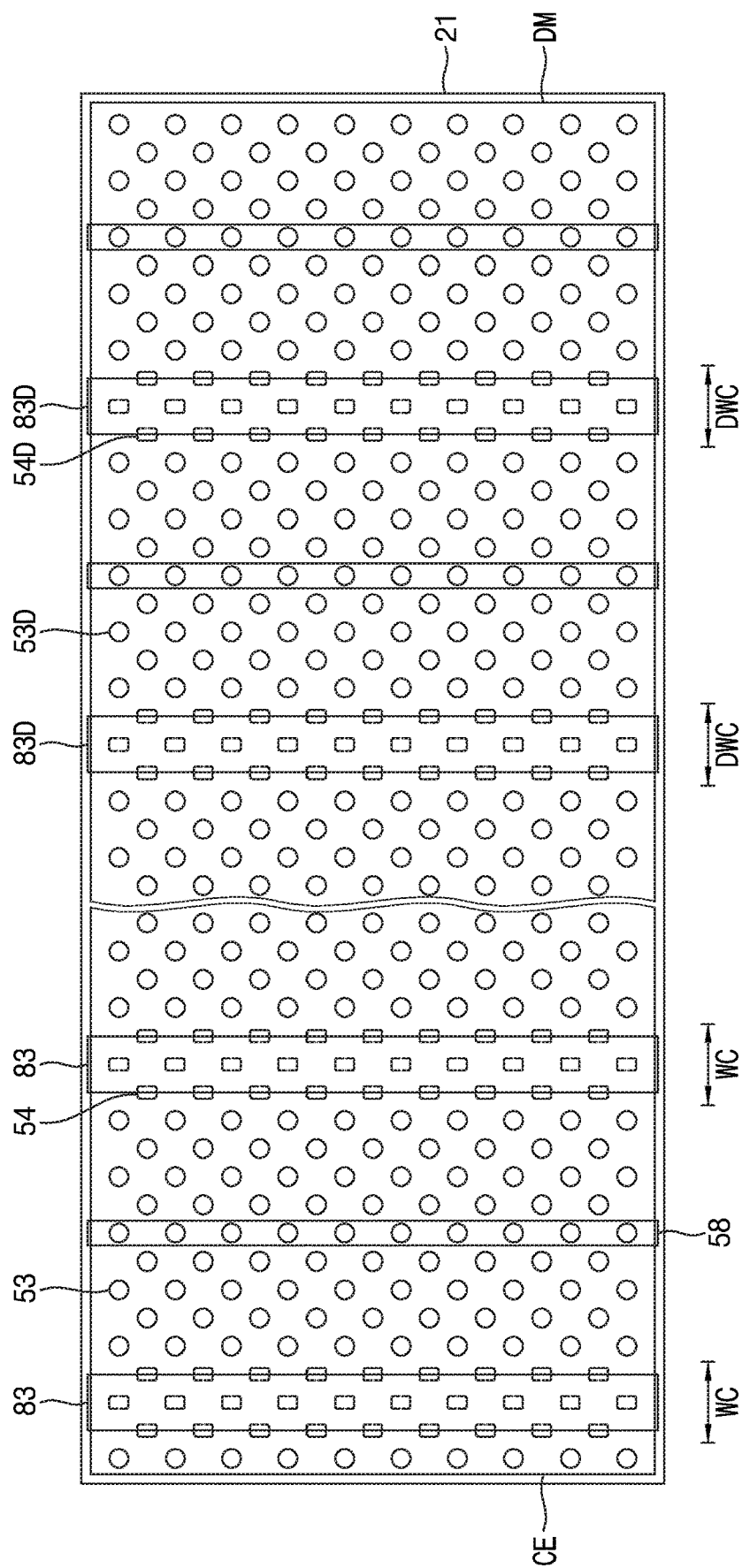
FIGS. 20 and 21 are layouts for describing semiconductor devices according to example embodiments of the inventive concepts.
Figure 21:
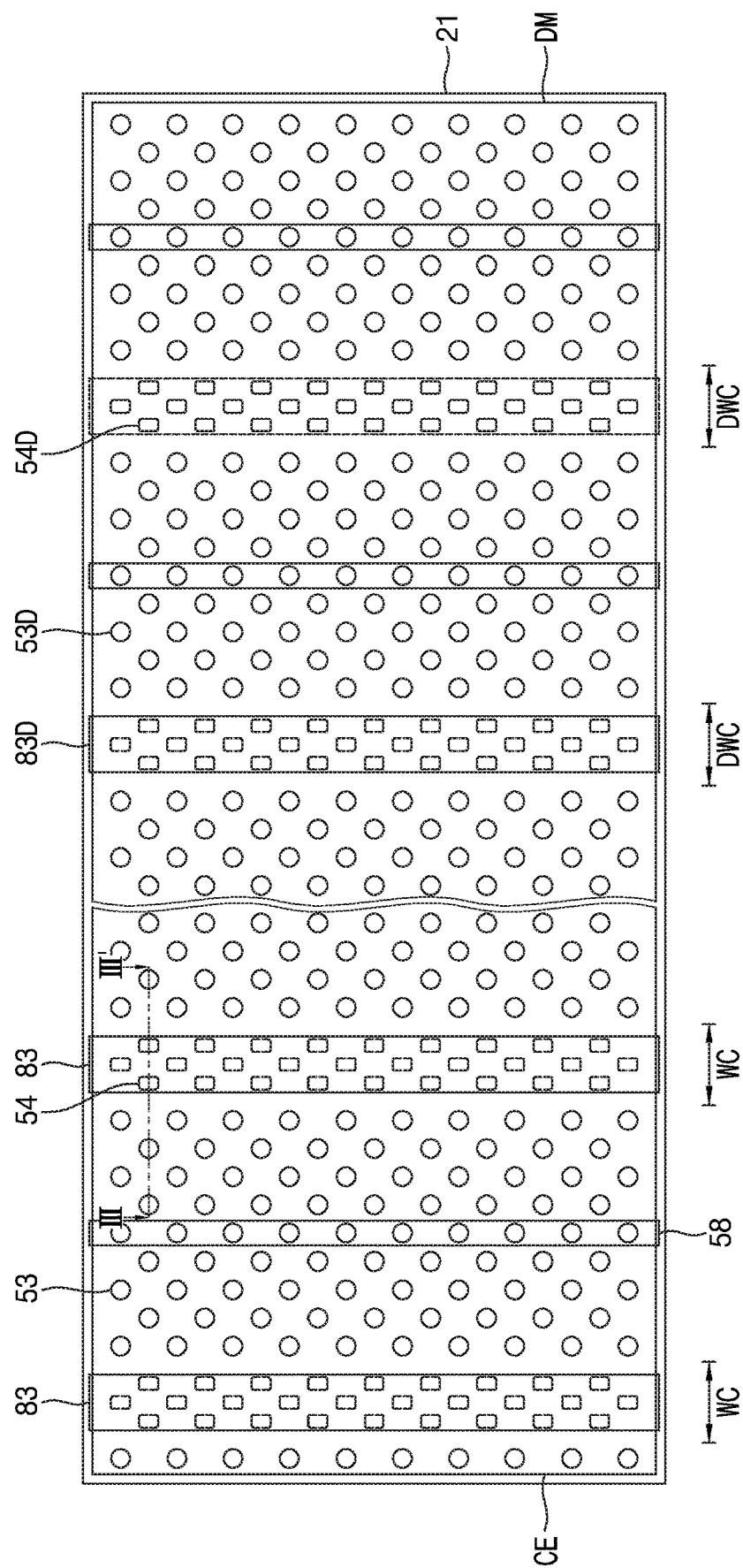
Figure 22:
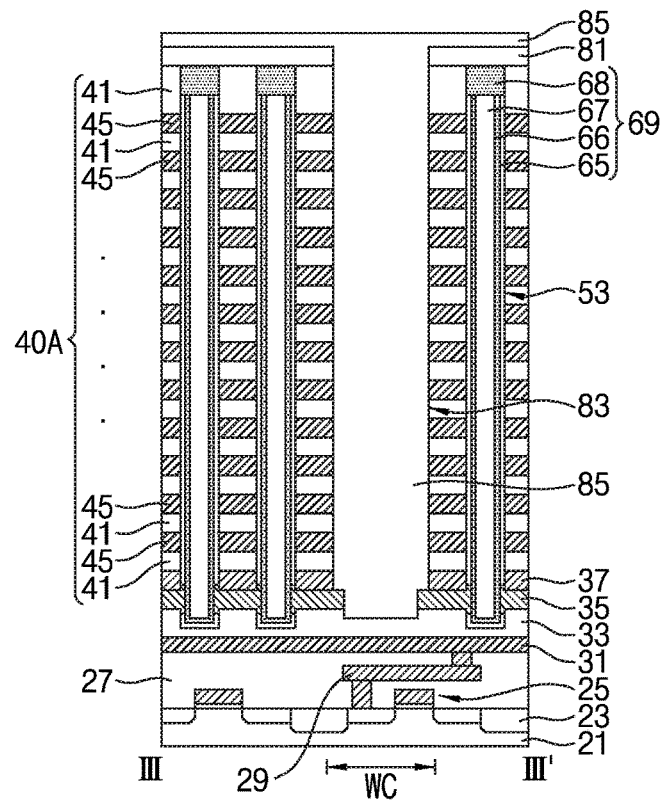
FIG. 22 is a cross-sectional view taken along line of FIG. 21.

FIGS. 20 and 21 are layouts for describing semiconductor devices according to some example embodiments of the inventive concepts. FIG. 22 is a cross-sectional view taken along line of FIG. 21.

Referring to FIG. 20, a plurality of dummy isolation trenches 83D may be disposed in a plurality of dummy isolation regions DWC.

Referring to FIG. 21, a plurality of cell isolation trenches 83 may completely overlap a plurality of cell ghost holes 54. At least one dummy isolation trench 83D may completely overlap a plurality of dummy ghost holes 54D. Accordingly, after formation of the plurality of cell isolation trenches 83 and/or the at least one dummy isolation trench 83D, the plurality of cell ghost holes 54 and/or plurality of dummy ghost holes 54D may be removed from the semiconductor devices. In at least one of the plurality of dummy isolation regions DWC, the dummy isolation trench 83D may be omitted. The plurality of dummy ghost holes 54D may remain in the at least one of the plurality of dummy isolation regions DWC in which the dummy isolation trench 83D is omitted.

Referring to FIG. 22, the cell isolation trench 83 and an isolation insulating layer 85 may be disposed in a cell isolation region WC. During formation of the cell isolation trench 83, at least some of the plurality of cell ghost holes 54 (see FIG. 1) and/or the plurality of cell ghost patterns 79R (see FIG. 1) may be removed.

Figure 28:
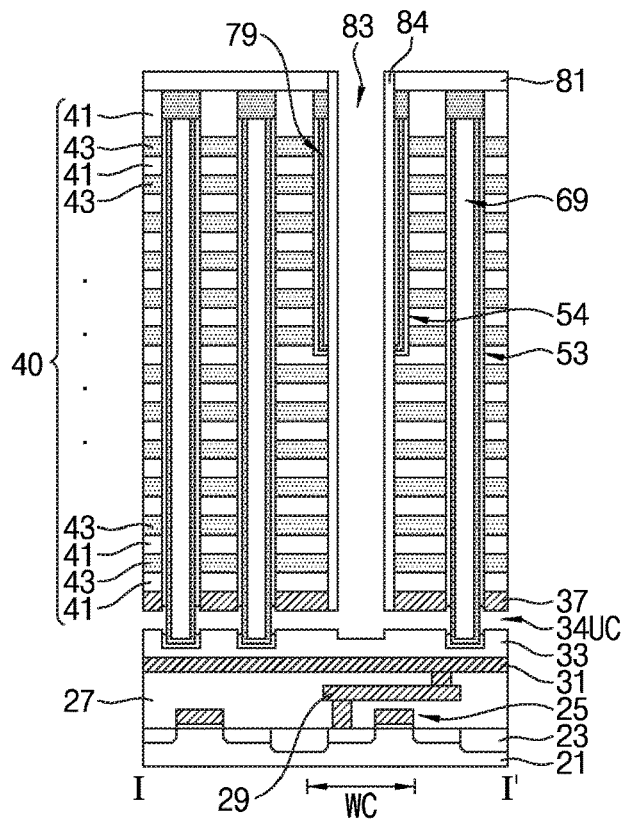
Figure 29:
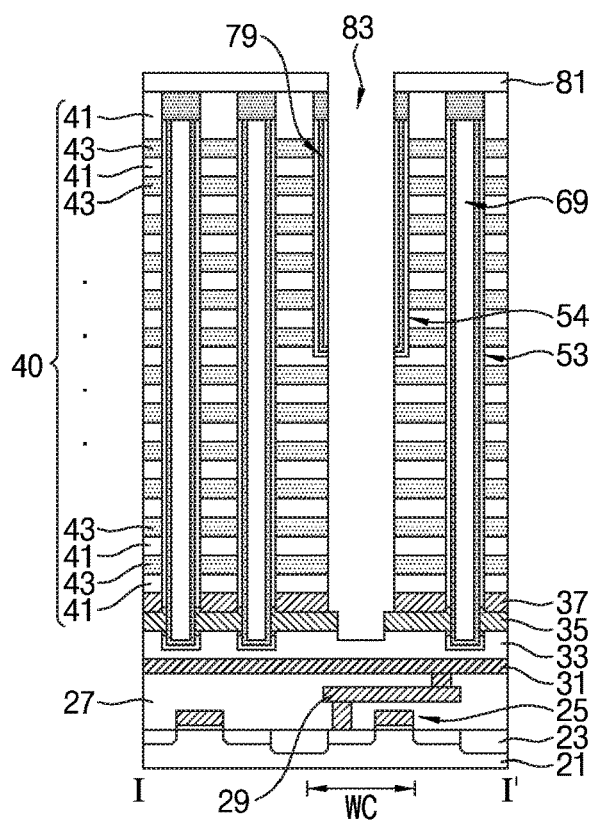
Figure 30:
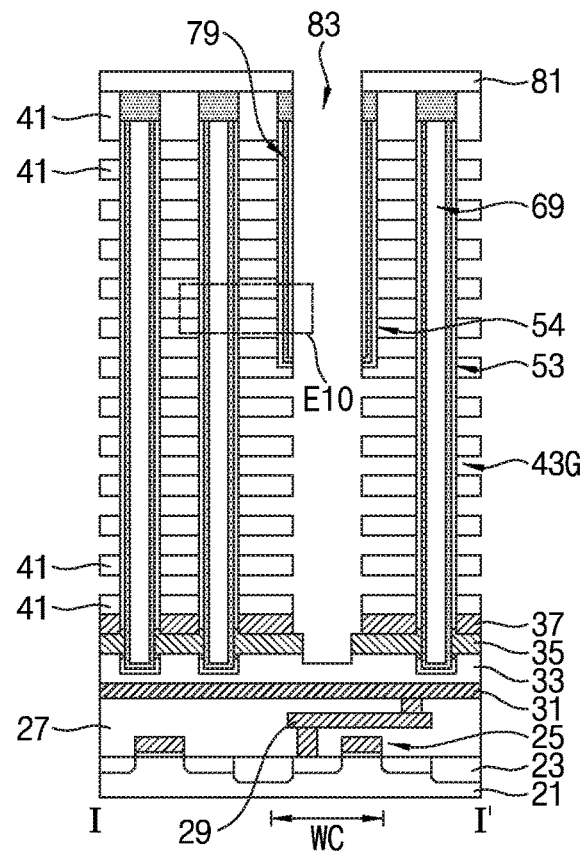
Figure 31:
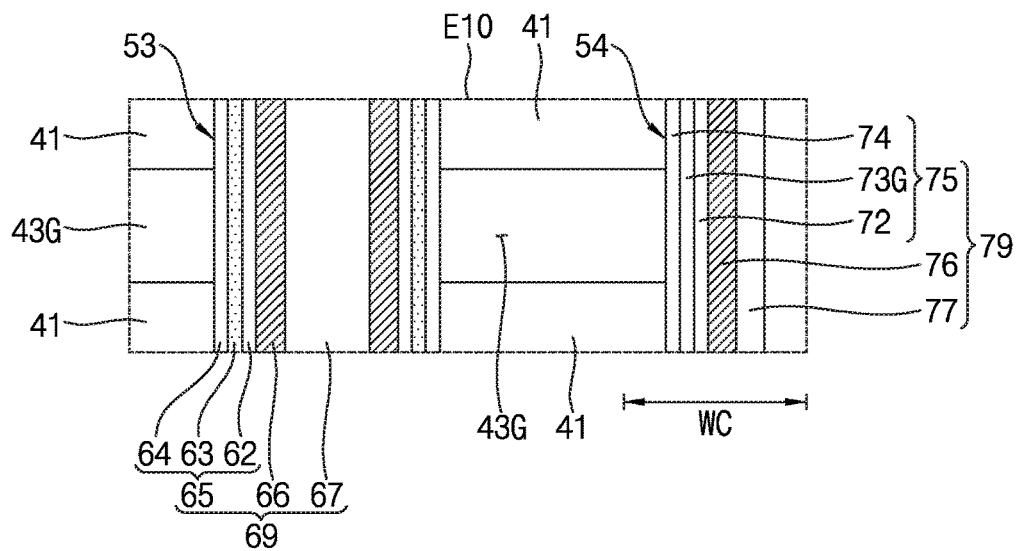
FIG. 31 is an enlarged view showing a portion E10 of FIG. 30 in detail.
Figure 32:
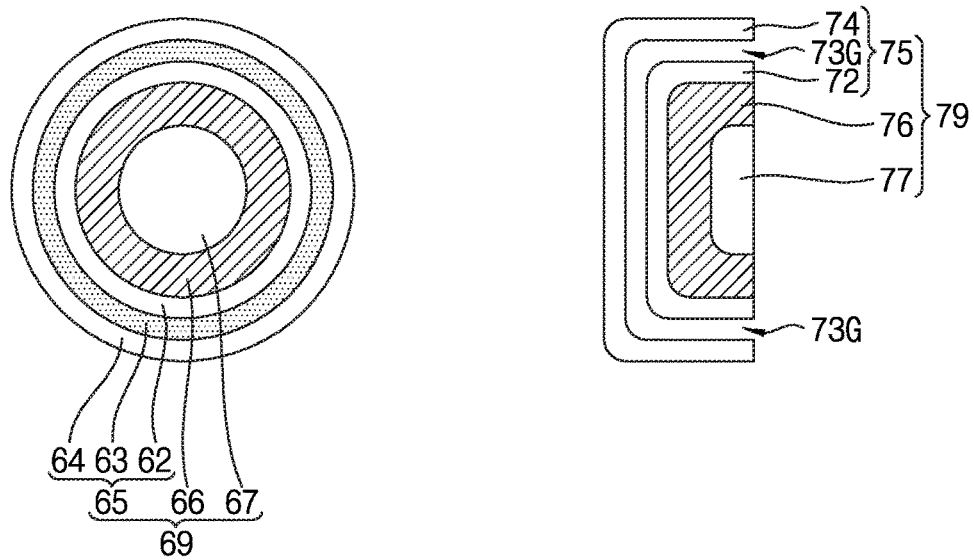
FIG. 32 is a horizontal sectional view showing a main configuration of FIG. 31.

FIGS. 23 to 30 and 33 are cross-sectional views taken along line I-I' of FIG. 3 for describing methods of forming semiconductor devices according to some example embodiments of the inventive concepts, FIG. 31 is an enlarged view showing a portion E10 of FIG. 30 in detail, and FIG. 32 is a horizontal sectional view showing a main configuration of FIG. 31.

Figure 23:
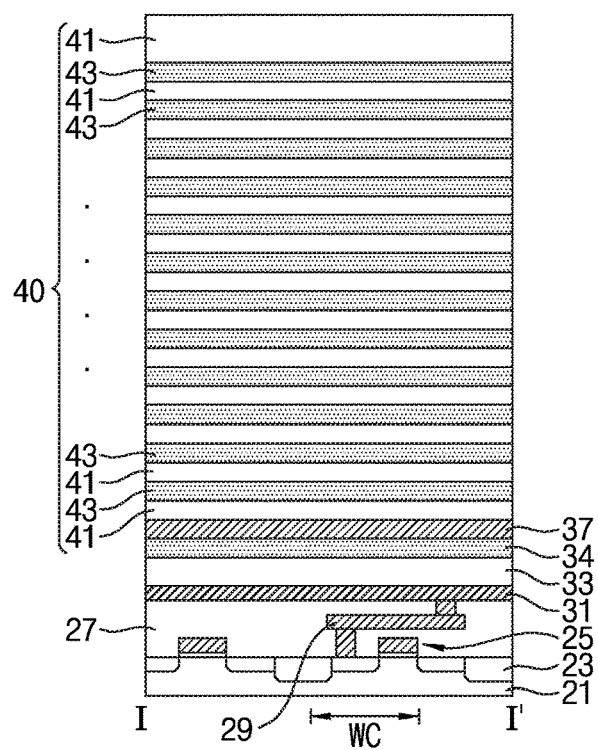
FIGS. 23 to 30 and 33 are cross-sectional views taken along line I-I' of FIG. 3 for describing methods of forming semiconductor devices according to example embodiments of the inventive concepts.

Referring to FIG. 23, a device isolation layer 23, a plurality of transistors 25, a first insulating layer 27, a plurality of peripheral circuit interconnections 29, a lower embedded conductive layer 31, an intermediate embedded conductive layer 33, a source mold layer 34, a support plate 37, and a non-active stacked structure 40 may be formed on a substrate 21. The non-active stacked structure 40 may include a plurality of insulating layers 41 and a plurality of mold layers 43 which may be alternately and repeatedly stacked. The non-active stacked structure 40 may correspond to a spare stacked structure.

The substrate 21 may include a semiconductor substrate such as a silicon wafer. The device isolation layer 23 may include an insulating layer formed by a shallow trench isolation (STI) method. The device isolation layer 23 may include silicon oxide, silicon nitride, silicon oxynitride, or a combination thereof. The plurality of transistors 25 may include one or more Fin Field-effect transistors (FinFETs), one or more multi-bridge channel (MBC) transistors, one or more nanowire transistors, one or more vertical transistors, one or more recess channel transistors, one or more 3D transistors, one or more planar transistors, or combinations thereof. The plurality of peripheral circuit interconnections 29 may include horizontal interconnections and vertical interconnections having various shapes.

The first insulating layer 27 may include silicon oxide, silicon nitride, silicon oxynitride, low-K dielectrics, or a combination thereof. The lower embedded conductive layer 31 may be electrically connected to the plurality of peripheral circuit interconnections 29. The plurality of peripheral circuit interconnections 29 and the lower embedded conductive layer 31 may include a metal, a metal nitride, a metal oxide, a metal silicide, polysilicon, a conductive carbon, or a combination thereof. The intermediate embedded conductive layer 33 may include a semiconductor layer such as polysilicon containing N-type impurities.

As shown in FIG. 12, the source mold layer 34 may include a lower source mold layer 34A, an intermediate source mold layer 34M, and an upper source mold layer 34B, which may be sequentially stacked. In some example embodiments, the lower source mold layer 34A may include silicon oxide, the intermediate source mold layer 34M may include silicon nitride, and the upper source mold layer 34B may include silicon oxide.

The support plate 37 may include a semiconductor layer such as polysilicon. The non-active stacked structure 40 may be formed on the support plate 37. The plurality of mold layers 43 may include a material different from that of the plurality of insulating layers 41. For example, the plurality of mold layers 43 may include silicon nitride, and the plurality of insulating layers 41 may include silicon oxide.

Figure 24:
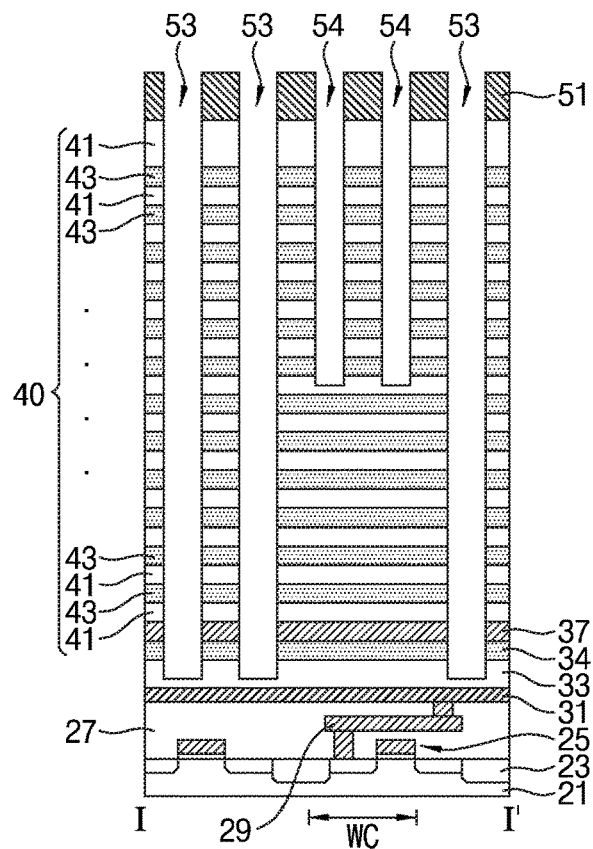

Referring to FIG. 24, a first mask pattern 51 may be formed on the non-active stacked structure 40. A plurality of cell channel holes 53 and a plurality of cell ghost holes 54 may be formed using the first mask pattern 51 as an etch mask. The plurality of cell channel holes 53 and the plurality of cell ghost holes 54 may be formed using an anisotropic etching process. A horizontal width of each of the plurality of cell ghost holes 54 may be less than a horizontal width of each of the plurality of cell channel holes 53. Bottoms of the plurality of cell ghost holes 54 may be formed at a higher level than bottoms of the plurality of cell channel holes 53.

The plurality of cell channel holes 53 and the plurality of cell ghost holes 54 may extend into the non-active stacked structure 40. In some example embodiments, the plurality of cell channel holes 53 may pass through (e.g., may completely pass through) the non-active stacked structure 40, the support plate 37, and the source mold layer 34. The intermediate embedded conductive layer 33 may be exposed to the bottoms of the plurality of cell channel holes 53. The plurality of cell ghost holes 54 may partially pass through the non-active stacked structure 40. One selected from among the plurality of insulating layers 41 or the plurality of mold layers 43 may be exposed to the bottoms of the plurality of cell ghost holes 54.

Referring again to FIGS. 4 to 7, the plurality of cell ghost holes 54 may assist to provide more uniform control of an aperture ratio of the first mask pattern 51. The plurality of cell ghost holes 54 may serve to reduce process defects such as bending and/or not opening of the plurality of cell channel holes 53.

Figure 25:
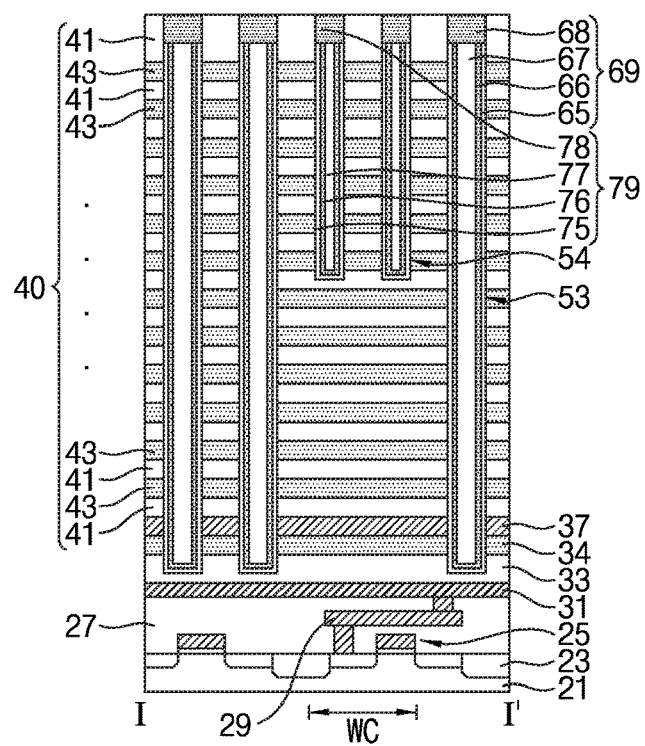

Referring to FIG. 25, a plurality of cell channel structures 69 may be formed in the plurality of cell channel holes 53, and a plurality of dummy ghost patterns 79 may be formed in the plurality of cell ghost holes 54. Each of the plurality of cell channel structures 69 may include an information storage pattern 65, a channel pattern 66, a core pattern 67, and a bit pad 68. As shown in FIGS. 8 and 9, the information storage pattern 65 may include a tunnel insulation layer 62, a charge storage layer 63, and a blocking layer 64.

The core pattern 67 may include an insulating layer such as silicon oxide or a semiconductor layer such as polysilicon. The channel pattern 66 may surround an outer side of the core pattern 67. The channel pattern 66 may include a semiconductor layer such as polysilicon. The tunnel insulation layer 62 may surround an outer side of the channel pattern 66. The tunnel insulation layer 62 may include an insulating layer such as silicon oxide. The charge storage layer 63 may surround an outer side of the tunnel insulation layer 62. The charge storage layer 63 may include silicon nitride. The blocking layer 64 may surround an outer side of the charge storage layer 63. The blocking layer 64 may include silicon oxide, a metal oxide, or a combination thereof. The bit pad 68 may include a conductive layer such as polysilicon, a metal, a metal silicide, a metal nitride, a metal oxide, a conductive carbon, or a combination thereof.

The plurality of dummy ghost patterns 79 may correspond to spare ghost patterns. Each of the plurality of dummy ghost patterns 79 may include a dummy ghost information storage pattern 75, a ghost channel 76, a ghost core 77, and a pad 78. As shown in FIGS. 10 and 11, the dummy ghost information storage pattern 75 may include a ghost tunnel layer 72 which surrounds an outer side of the ghost channel 76, a ghost charge storage layer 73 which surrounds an outer side of the ghost tunnel layer 72, and a ghost blocking layer 74 which surrounds an outer side of the ghost charge storage layer 73.

Each of the ghost tunnel layer 72, the ghost charge storage layer 73, the ghost blocking layer 74, the ghost channel 76, the ghost core 77, and the pad 78 may include the same material formed simultaneously with a corresponding one of the tunnel insulation layer 62, the charge storage layer 63, the blocking layer 64, the channel pattern 66, the core pattern 67, and the bit pad 68.

The plurality of cell channel structures 69 and the plurality of dummy ghost patterns 79 may be formed using a plurality of thin film forming processes and at least one planarization process. The at least one planarization process may include a chemical mechanical polishing (CMP) process, an etch-back process, or a combination thereof. Upper surfaces of the non-active stacked structure 40, the plurality of cell channel structures 69, and the plurality of dummy ghost patterns 79 may be exposed on substantially the same surface.

Figure 26:
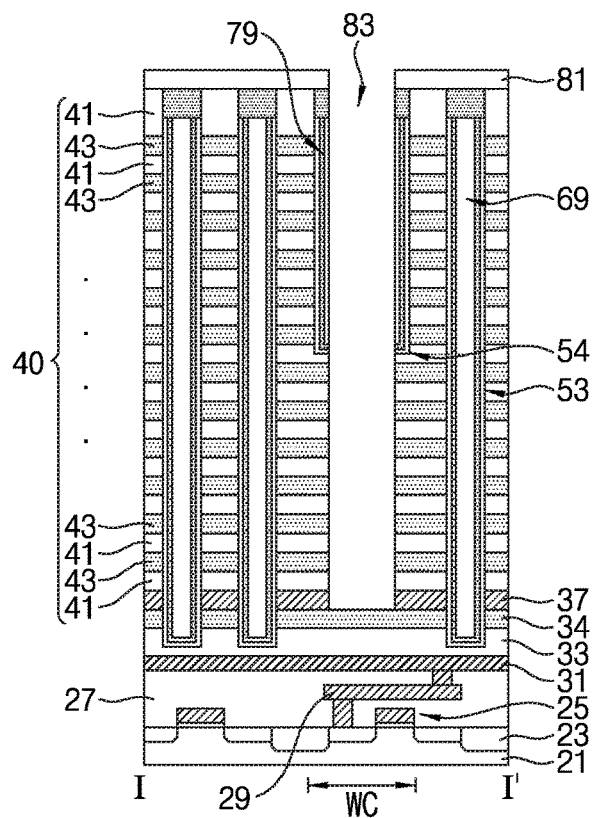

Referring to FIG. 26, a third insulating layer 81 may be formed on the non-active stacked structure 40, the plurality of cell channel structures 69, and the plurality of dummy ghost patterns 79. A cell isolation trench 83 may be formed in a cell isolation region WC. The cell isolation trench 83 may vertically pass through the third insulating layer 81, the non-active stacked structure 40, and the support plate 37. The source mold layer 34 may be exposed to a bottom of the cell isolation trench 83. The cell isolation trench 83 may vertically pass through at least portions of some of the plurality of cell ghost holes 54 and the plurality of dummy ghost patterns 79. Remaining portions of the plurality of dummy ghost patterns 79 may be exposed to sidewalls of the cell isolation trench 83.

Figure 27:
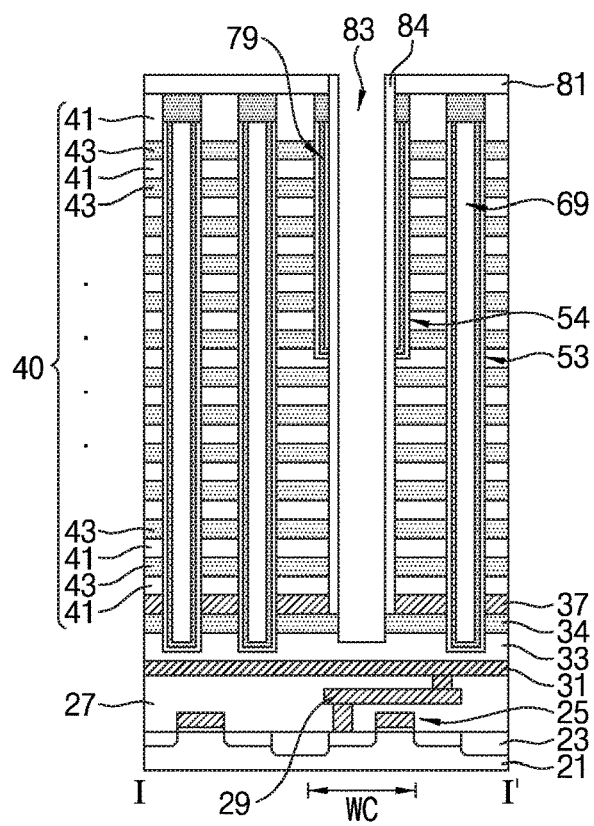

Referring to FIG. 27, a sacrificial spacer 84 may be formed on the sidewalls of the cell isolation trench 83. The sacrificial spacer 84 may be formed using a thin film forming process and an anisotropic etching process. The sacrificial spacer 84 may include a material having an etch selectivity with respect to the source mold layer 34, the plurality of insulating layers 41, and the plurality of mold layers 43. For example, the sacrificial spacer 84 may include polysilicon.

Referring to FIG. 28, the source mold layer 34 may be removed and an undercut region 34UC may be formed below the support plate 37.

Referring to FIG. 29, an alternate conductive line 35 may be formed in the undercut region 34UC. The sacrificial spacer 84 may be removed so that portions of the plurality of insulating layers 41, the plurality of mold layers 43, and the plurality of dummy ghost patterns 79 may be exposed to the sidewalls of the cell isolation trench 83. The alternate conductive line 35 may include a metal, a metal nitride, a metal oxide, a metal silicide, polysilicon, a conductive carbon, or a combination thereof. In an example embodiment, the alternate conductive line 35 may include a semiconductor layer such as polysilicon containing N-type impurities.

Referring to FIG. 30, a plurality of gap regions 43G may be formed by removing the plurality of mold layers 43.

Referring to FIGS. 31 and 32, while the plurality of mold layers 43 are removed, the ghost charge storage layer 73 in the plurality of dummy ghost patterns 79 may be removed so that a narrow gap 73G may be formed.

Figure 33:
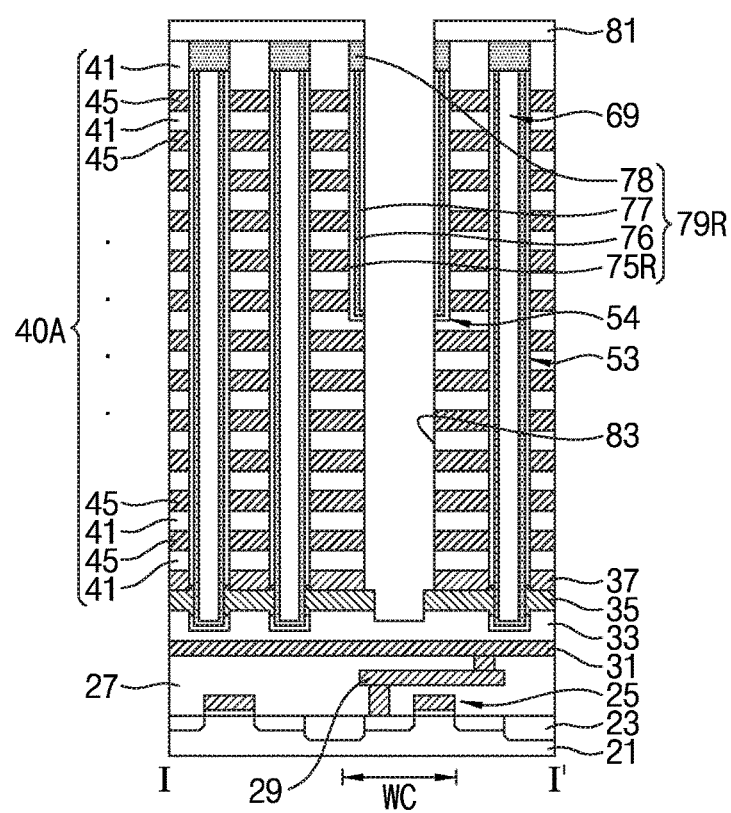

Referring to FIG. 33, a plurality of electrode layers 45 may be formed in the plurality of gap regions 43G. The plurality of insulating layers 41 and the plurality of electrode layers 45 may constitute an active stacked structure 40A. The plurality of electrode layers 45 may include a metal, a metal nitride, a metal oxide, a metal silicide, polysilicon, a conductive carbon, or a combination thereof.

While the plurality of electrode layers 45 are formed, a ghost exchange layer 73R may be formed in the narrow gap 73G as shown in FIGS. 8 and 9. The ghost tunnel layer 72, the ghost exchange layer 73R, and the ghost blocking layer 74 may constitute a cell ghost information storage pattern 75R. The cell ghost information storage pattern 75R, the ghost channel 76, the ghost core 77, and the pad 78 may constitute a cell ghost pattern 79R.

The ghost exchange layer 73R may include a material different from that of the charge storage layer 63. The ghost exchange layer 73R may include the same material as the plurality of electrode layers 45. The ghost exchange layer 73R may include W, Ti, TiN, Ta, TaN, AlO, SiN, SiON, or a combination thereof. For example, the ghost exchange layer 73R may include a W layer. The ghost exchange layer 73R may include a W layer and a TiN layer. The ghost exchange layer 73R may include an AlO layer. The ghost exchange layer 73R may include an AlO layer and a SiN layer.

Referring again to FIG. 1, an isolation insulating layer 85 which fills an inside of the cell isolation trench 83 may be formed. Each of the third insulating layer 81 and the isolation insulating layer 85 may include an insulating material such as silicon oxide.

Referring again to FIGS. 1 and 2, while the components shown in FIG. 1 are formed in the first region CE, the components shown in FIG. 2 may be formed in the second region DM.

FIGS. 34 to 39 are cross-sectional views taken along line I-I' of FIG. 3 for describing methods of forming semiconductor devices according to some example embodiments of the inventive concepts.

Figure 34:
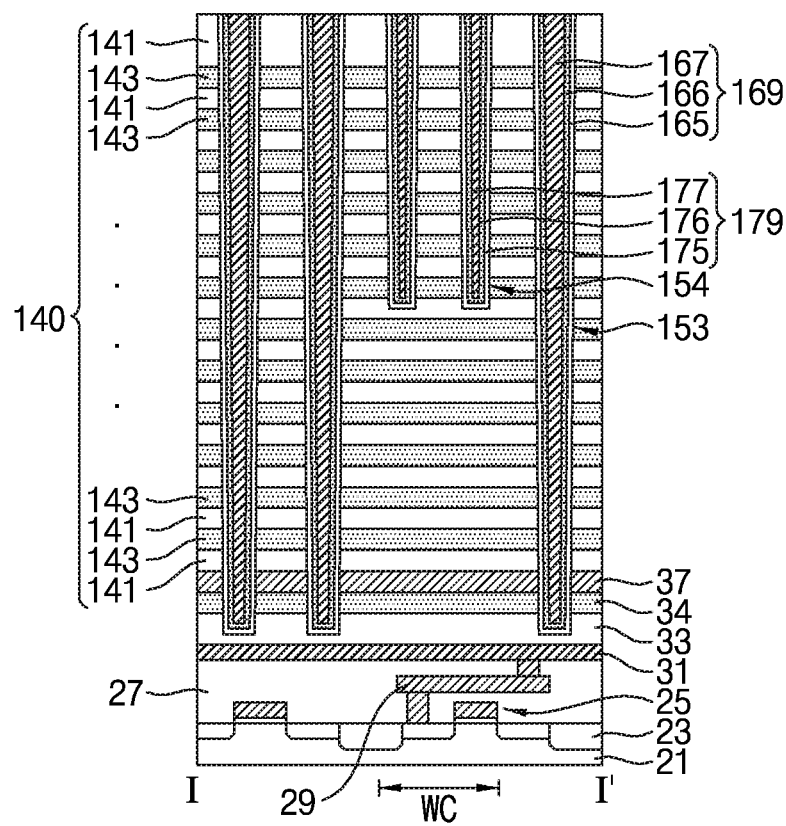
FIGS. 34 to 39 are cross-sectional views taken along line I-I' of FIG. 3 for describing methods of forming semiconductor devices according to example embodiments of the inventive concepts.

Referring to FIG. 34, a device isolation layer 23, a plurality of transistors 25, a first insulating layer 27, a plurality of peripheral circuit interconnections 29, a lower embedded conductive layer 31, an intermediate embedded conductive layer 33, a source mold layer 34, a support plate 37, a lower non-active stacked structure 140, a plurality of lower cell channel holes 153, a plurality of lower cell ghost holes 154, a plurality of lower sacrificial channel structures 169, and a plurality of lower dummy ghost patterns 179 may be formed on a substrate 21. The lower non-active stacked structure 140 may include a plurality of lower insulating layers 141 and a plurality of lower mold layers 143 which are alternately and repeatedly stacked. The lower non-active stacked structure 140 may correspond to a spare stacked structure.

Each of the plurality of lower sacrificial channel structures 169 may include a first sacrificial layer 165, a second sacrificial layer 166, and a third sacrificial layer 167. In an example embodiment, the first sacrificial layer 165 may include silicon oxide. The second sacrificial layer 166 may include silicon nitride. The third sacrificial layer 167 may include polysilicon. Each of the plurality of lower dummy ghost patterns 179 may include a first dummy pattern 175, a second dummy pattern 176, and a third dummy pattern 177. The second dummy pattern 176 may surround an outer side of the third dummy pattern 177. The first dummy pattern 175 may surround an outer side of the second dummy pattern 176. Each of the first dummy pattern 175, the second dummy pattern 176, and the third dummy pattern 177 may include the same material formed simultaneously with a corresponding one of the first sacrificial layer 165, the second sacrificial layer 166, and the third sacrificial layer 167.

Bottoms of the plurality of lower cell ghost holes 154 may be formed at a higher level than bottoms of the plurality of lower cell channel holes 153. Upper surfaces of the lower non-active stacked structure 140, the plurality of lower sacrificial channel structures 169, and the plurality of lower dummy ghost patterns 179 may be exposed on substantially the same surface.

Figure 35:
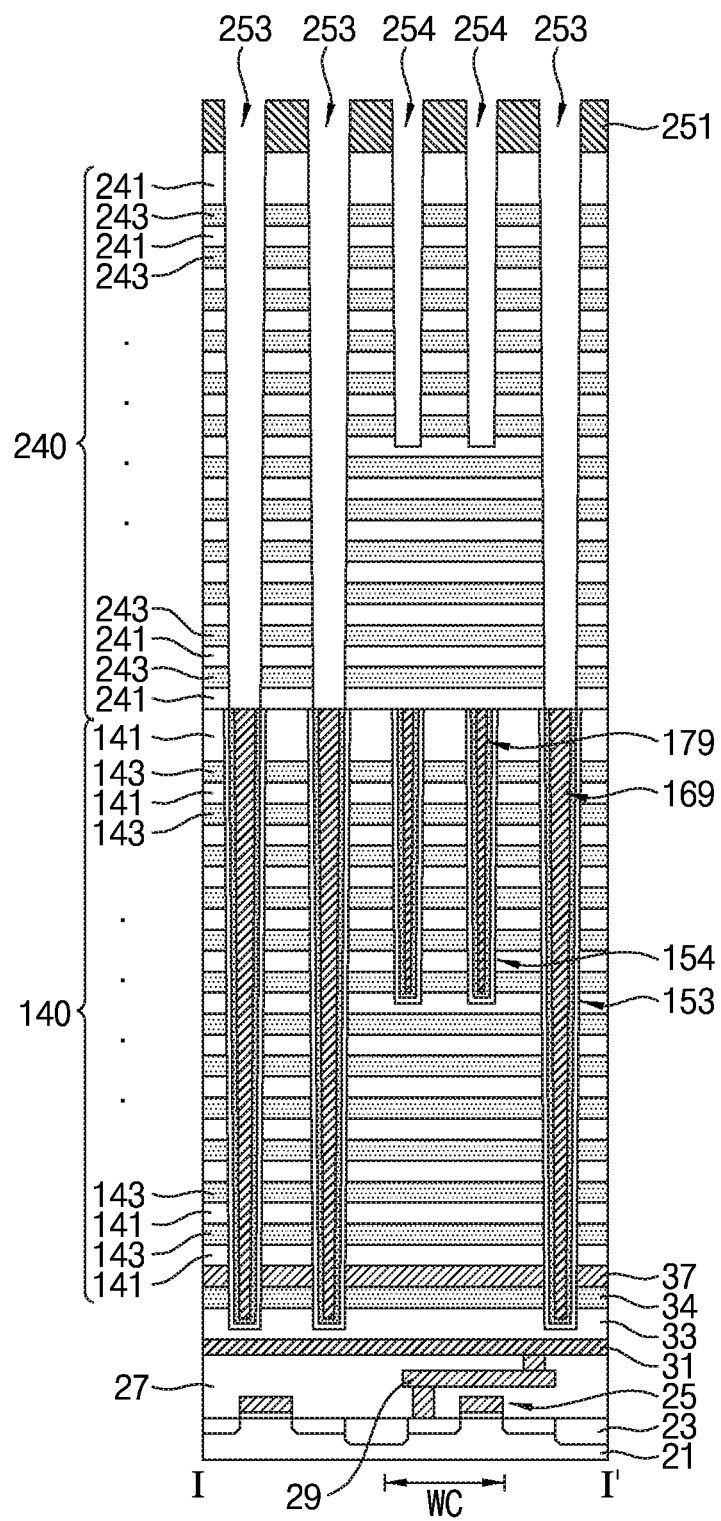

Referring to FIG. 35, an upper non-active stacked structure 240 may be formed on the lower non-active stacked structure 140, the plurality of lower sacrificial channel structures 169, and the plurality of lower dummy ghost patterns 179. The upper non-active stacked structure 240 may include a plurality of upper insulating layers 241 and a plurality of upper mold layers 243 which are alternately and repeatedly stacked. The upper non-active stacked structure 240 may correspond to a spare stacked structure.

A second mask pattern 251 may be formed on the upper non-active stacked structure 240. A plurality of upper cell channel holes 253 and a plurality of upper cell ghost holes 254 may be formed using the second mask pattern 251 as an etch mask. A horizontal width of each of the plurality of upper cell ghost holes 254 may be less than a horizontal width of each of the plurality of upper cell channel holes 253. Bottoms of the plurality of upper cell ghost holes 254 may be formed at a higher level than bottoms of the plurality of upper cell channel holes 253.

In an example embodiment, the plurality of upper cell channel holes 253 may pass through (e.g., may pass completely through) the upper non-active stacked structure 240 to communicate with the plurality of lower cell channel holes 153. The third sacrificial layer 167 may be exposed to the bottoms of the plurality of upper cell channel holes 253. The plurality of upper cell ghost holes 254 may partially pass through the upper non-active stacked structure 240. One selected from among the plurality of upper insulating layers 241 or the plurality of upper mold layers 243 may be exposed to the bottoms of the plurality of upper cell ghost holes 254.

Figure 36:
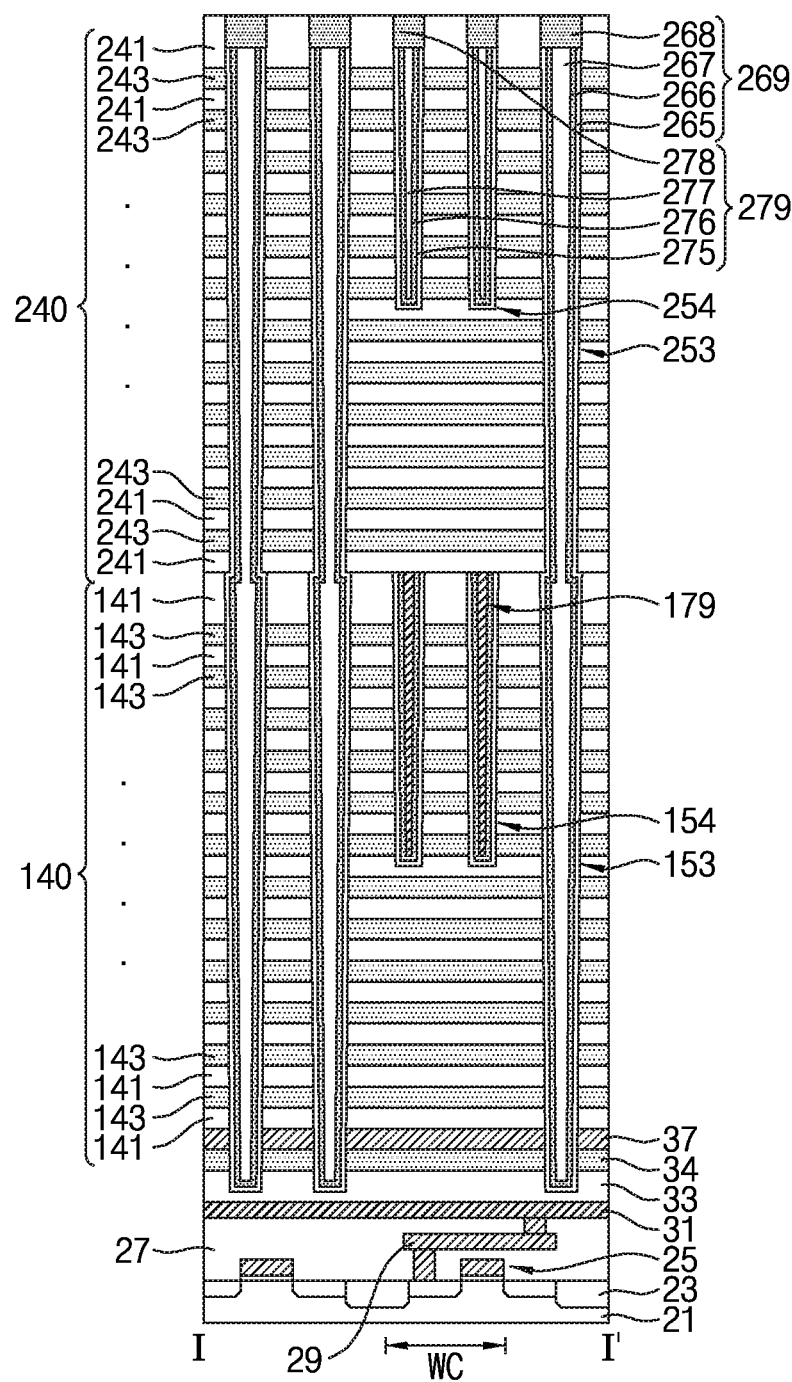

Referring to FIG. 36, the plurality of lower sacrificial channel structures 169 may be removed. A plurality of cell channel structures 269 may be formed in the plurality of upper cell channel holes 253 and the plurality of lower cell channel holes 153. A plurality of upper dummy ghost patterns 279 may be formed in the plurality of upper cell ghost holes 254.

Each of the plurality of cell channel structures 269 may include an information storage pattern 265, a channel pattern 266, a core pattern 267, and a bit pad 268. Each of the plurality of upper dummy ghost patterns 279 may include an upper dummy ghost information storage pattern 275, an upper ghost channel 276, an upper ghost core 277, and an upper pad 278. Each of the upper dummy ghost information storage pattern 275, the upper ghost channel 276, the upper ghost core 277, and the upper pad 278 may include the same material formed simultaneously with a corresponding one of the information storage pattern 265, the channel pattern 266, the core pattern 267, and the bit pad 268. Upper surfaces of the upper non-active stacked structure 240, the plurality of cell channel structures 269, and the plurality of upper dummy ghost patterns 279 may be exposed on substantially the same surface.

Figure 37:
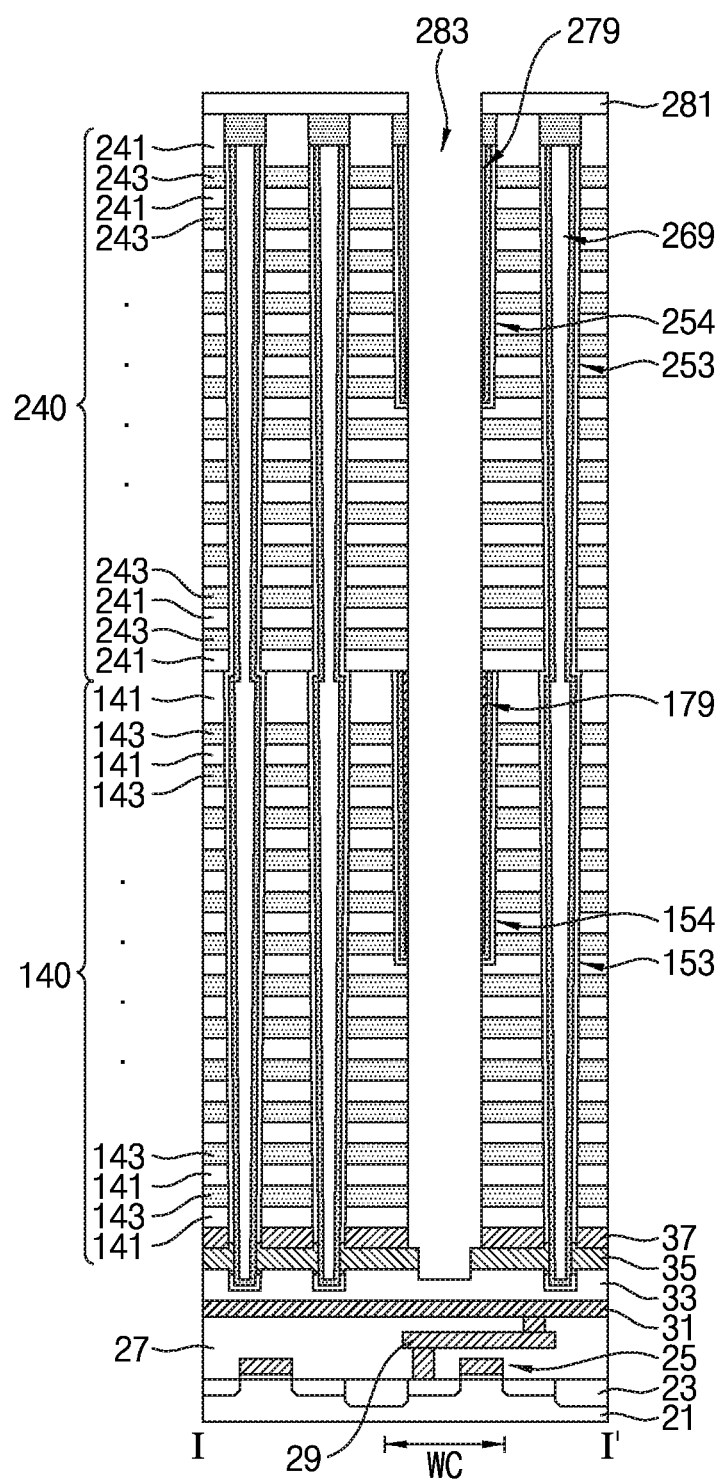

Referring to FIG. 37, a third insulating layer 281 may be formed on the upper non-active stacked structure 240, the plurality of cell channel structures 269, and the plurality of upper dummy ghost patterns 279. A cell isolation trench 283 may be formed in the cell isolation region WC. The cell isolation trench 283 may vertically pass through the third insulating layer 281, the upper non-active stacked structure 240, the lower non-active stacked structure 140, and the support plate 37. The source mold layer 34 may be removed and an alternate conductive line 35 may be formed. The cell isolation trench 283 may vertically pass through at least a portion of the plurality of lower cell ghost holes 154, the plurality of lower dummy ghost patterns 179, the plurality of upper cell ghost holes 254, and the plurality of upper dummy ghost patterns 279. A portion of the plurality of lower dummy ghost patterns 179 and a portion of the plurality of upper dummy ghost patterns 279 may be exposed to sidewalls of the cell isolation trench 283.

Figure 38:
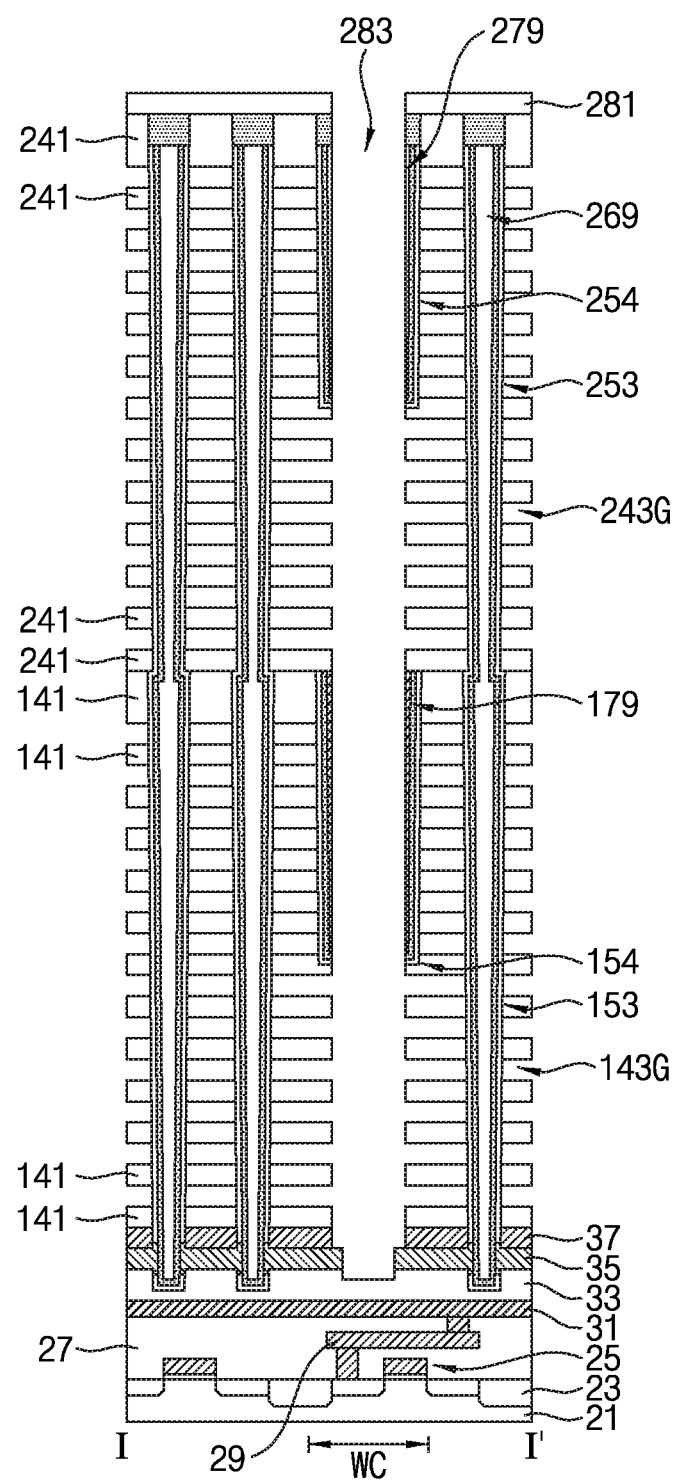

Referring to FIG. 38, a plurality of lower gap regions 143G and a plurality of upper gap regions 243G may be formed by removing the plurality of lower mold layers 143 and the plurality of upper mold layers 243.

Figure 39:
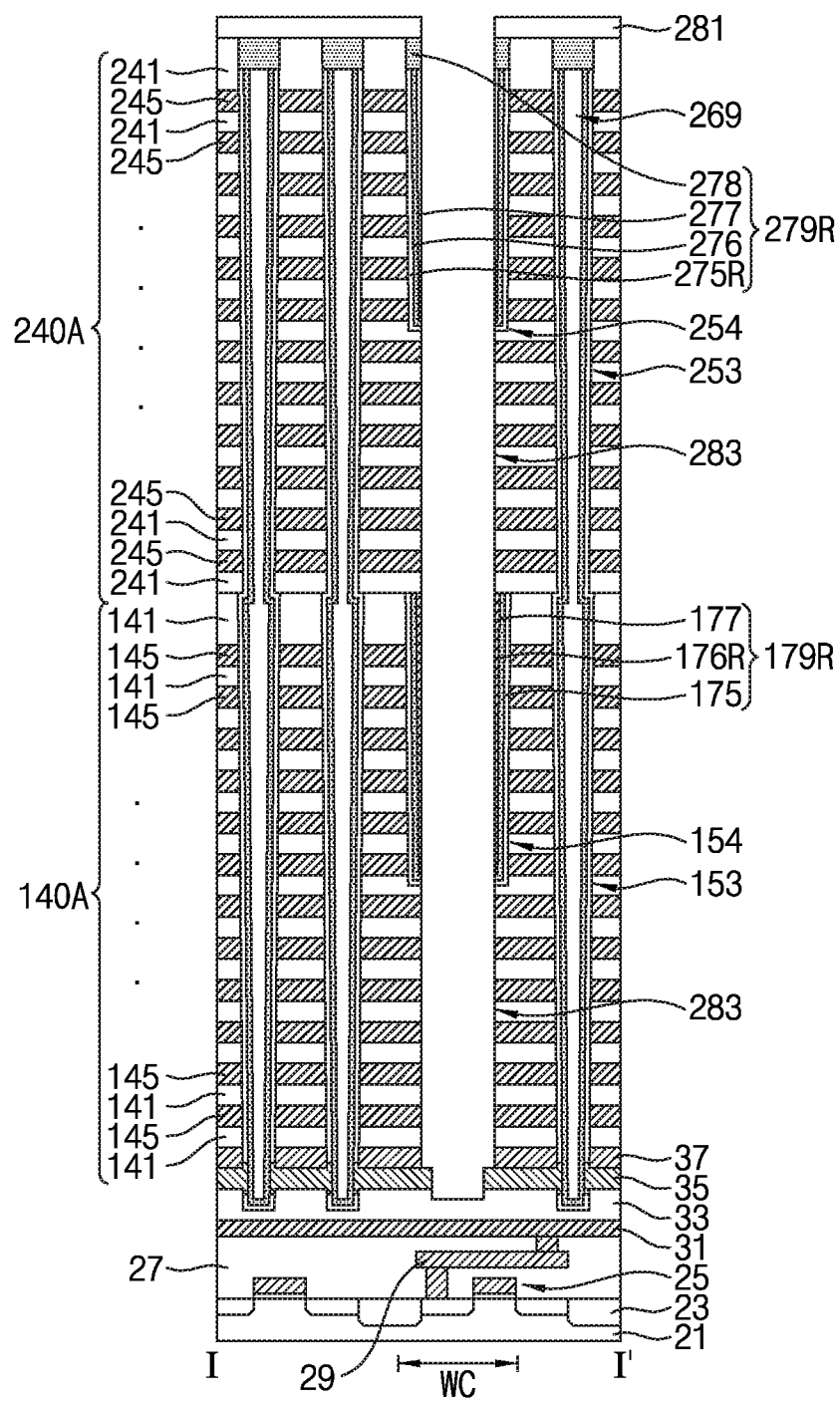

Referring to FIG. 39, a plurality of lower electrode layers 145 and a plurality of upper electrode layers 245 may be formed in the plurality of lower gap regions 143G and the plurality of upper gap regions 243G. The plurality of lower insulating layers 141 and the plurality of lower electrode layers 145 may constitute a lower active stacked structure 140A. The plurality of upper insulating layers 241 and the plurality of upper electrode layers 245 may constitute an upper active stacked structure 240A.

While the plurality of lower electrode layers 145 and the plurality of upper electrode layers 245 are formed, the upper ghost charge storage layer 273 may be removed and an upper ghost exchange layer 273R may be formed, as shown in FIG. 16. The upper ghost tunnel layer 272, the upper ghost exchange layer 273R, and the upper ghost blocking layer 274 may constitute an upper cell ghost information storage pattern 275R. The upper cell ghost information storage pattern 275R, the upper ghost channel 276, and the upper ghost core 277 may constitute an upper cell ghost pattern 279R.

While the plurality of lower electrode layers 145 and the plurality of upper electrode layers 245 are formed, the second dummy pattern 176 may be removed and a second dummy exchange pattern 176R may be formed, as shown in FIG. 17. The first dummy pattern 175, the second dummy exchange pattern 176R, and the third dummy pattern 177 may constitute a lower cell ghost pattern 179R.

Referring again to FIG. 14, an isolation insulating layer 285 which fills an inside of the cell isolation trench 283 may be formed.

Referring again to FIGS. 14 and 15, while the components shown in FIG. 14 are formed in the first region CE, the components shown in FIG. 15 may be formed in the second region DM. In other words, the components formed in the first region CE may be formed contemporaneously with the components formed in the second region DM.

According to the example embodiments of the inventive concepts provided herein, a plurality of ghost holes may be provided in an isolation region. The plurality of ghost holes may serve to provide more uniformity to an aperture ratio of a mask pattern. The plurality of ghost holes may also serve to reduce process defects such as bending and/or not opening of a plurality of cell channel holes. Accordingly, aspects of the present disclosure may provide semiconductor devices having increased mass production efficiency and increased integration, which may be advantageous.

While aspects of the present disclosure have been described with reference to the accompanying drawings, it should be understood by those skilled in the art that various modifications may be made without departing from the scope of the inventive concepts and without changing essential features thereof. Therefore, the above-described embodiments are provided in a descriptive sense only and not for purposes of limitation.

What is claimed is:

1. A semiconductor device comprising:
   a substrate;
   a stacked structure comprising a plurality of insulating layers and a plurality of interconnection layers alternately stacked on the substrate;
   an isolation region crossing the stacked structure in a first direction;
   a plurality of first channel structures extending into the stacked structure in a second direction that is perpendicular to the first direction; and
   a plurality of first patterns in the isolation region and extending into the stacked structure in the second direction,
   wherein bottoms of the plurality of first patterns are farther in the second direction from an upper surface of the substrate than bottoms of the plurality of first channel structures.

2. The semiconductor device of claim 1, wherein the bottoms of the plurality of first patterns are farther in the second direction from the upper surface of the substrate than a lowermost layer of the plurality of interconnection layers.

3. The semiconductor device of claim 1, wherein a horizontal width of each of the plurality of first patterns is less than a horizontal width of each of the plurality of first channel structures.

4. The semiconductor device of claim 1, wherein the plurality of first channel structures extending into the stacked structure each have a first cross-section shape, and the plurality of first patterns extending into the stacked structure each have a second cross-section shape different from the first cross-section shape.

5. The semiconductor device of claim 1, further comprising:
   an isolation trench in the isolation region and extending through the stacked structure, wherein at least some of the first patterns border the isolation trench; and
   an isolation insulating layer in the isolation trench.

6. A semiconductor device comprising:
   a substrate having a first region and a second region adjacent to the first region;
   a first stacked structure in which a plurality of insulating layers and a plurality of dummy layers are alternately stacked in the second region on the substrate;
   an isolation region crossing the first stacked structure in a first direction;
   a plurality of dummy channel structures extending into the first stacked structure in a second direction perpendicular to the first direction; and
   a plurality of dummy patterns in the isolation region and extending into the first stacked structure in the second direction,
   wherein bottoms of the plurality of dummy patterns are farther in the second direction from an upper surface of the substrate than bottoms of the plurality of dummy channel structures.

7. The semiconductor device of claim 6, wherein the bottoms of the plurality of dummy patterns are farther from the upper surface of the substrate than a lowermost layer of the plurality of dummy layers.

8. The semiconductor device of claim 6, wherein two of the plurality of dummy channel structures adjacent to each other are spaced apart at a first distance, and wherein one of the plurality of dummy patterns adjacent to one of the two dummy channel structures is spaced apart from the adjacent one of the two dummy channel structures by the first distance.

9. The semiconductor device of claim 6, further comprising:
   a second stacked structure in which a plurality of insulating layers and a plurality of electrode layers are alternately stacked in the first region on the substrate;
   a cell isolation region that crosses the second stacked structure in the first direction; and
   a plurality of cell channel structures extending into the second stacked structures in the second direction.

10. The semiconductor device of claim 9, further comprising:
    a plurality of cell patterns extending into the second stacked structure in the second direction,
    wherein bottoms of the plurality of cell patterns are farther in the second direction from the upper surface of the substrate than bottoms of the plurality of cell channel structures.

11. The semiconductor device of claim 10, further comprising:
    a cell isolation trench in the cell isolation region and that passes through the second stacked structure; and
    an isolation insulating layer in the cell isolation trench,
    wherein the cell isolation trench passes through the plurality of cell patterns.

12. The semiconductor device of claim 11, wherein each of the plurality of cell channel structures and the plurality of dummy channel structures comprises:
    a channel pattern; and
    an information storage pattern surrounding an outer side of the channel pattern,
    wherein the information storage pattern comprises:
    a tunnel insulation layer surrounding the outer side of the channel pattern,
    a charge storage layer surrounding an outer side of the tunnel insulation layer, and
    a blocking layer surrounding an outer side of the charge storage layer.

13. The semiconductor device of claim 12, wherein each of the plurality of dummy patterns comprises:
a dummy channel pattern; and
a dummy information storage pattern surrounding an outer side of the dummy channel pattern,
wherein the dummy information storage pattern comprises:
a dummy tunnel layer surrounding the outer side of the dummy channel pattern,
a dummy charge storage layer surrounding an outer side of the dummy tunnel layer, and
a dummy blocking layer surrounding an outer side of the dummy charge storage layer, and
wherein each of the dummy channel pattern, the dummy tunnel layer, the dummy charge storage layer, and the dummy blocking layer of the dummy patterns comprises the same material as a corresponding one of the channel pattern, the tunnel insulation layer, the charge storage layer, and the blocking layer of the dummy channel structures.

14. The semiconductor device of claim 12, wherein each of the plurality of cell patterns comprises:
a channel; and
a cell information storage pattern between the channel and the second stacked structure,
wherein the cell information storage pattern comprises:
a tunnel layer between the channel and the second stacked structure,
an exchange layer between the tunnel layer and the second stacked structure, and
a blocking layer between the exchange layer and the second stacked structure, and
wherein each of the channel, the tunnel layer, and the blocking layer of the cell pattern comprises the same material as a corresponding one of the channel pattern, the tunnel insulation layer, and the blocking layer of the cell channel structures.

15. The semiconductor device of claim 14, wherein the exchange layer of the cell patterns comprises a material different from that of the charge storage layer of the cell channel structures.

16. The semiconductor device of claim 14, wherein the exchange layer of the cell pattern comprises the same material as the plurality of electrode layers.

* * * * *